US010665481B2

(12) United States Patent
Sano et al.

(10) Patent No.: US 10,665,481 B2
(45) Date of Patent: May 26, 2020

(54) SUBSTRATE PROCESSING APPARATUS AND SUBSTRATE PROCESSING METHOD FOR DISCHARGE OF PROCESSING LIQUID FROM NOZZLE

(71) Applicant: SCREEN Holdings Co., Ltd., Kyoto (JP)

(72) Inventors: Hiroshi Sano, Kyoto (JP); Hiroaki Kakuma, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 16/039,488

(22) Filed: Jul. 19, 2018

(65) Prior Publication Data

US 2018/0323085 A1 Nov. 8, 2018

Related U.S. Application Data

(62) Division of application No. 14/642,919, filed on Mar. 10, 2015, now abandoned.

(30) Foreign Application Priority Data

| Mar. 11, 2014 | (JP) | JP2014-047590 |
| Mar. 12, 2014 | (JP) | JP2014-048807 |
| Dec. 17, 2014 | (JP) | JP2014-254881 |

(51) Int. Cl.
*H01L 21/67* (2006.01)
*H01L 21/68* (2006.01)

(52) U.S. Cl.
CPC ...... *H01L 21/6708* (2013.01); *H01L 21/6715* (2013.01); *H01L 21/67051* (2013.01); *H01L 21/67259* (2013.01); *H01L 21/681* (2013.01)

(58) Field of Classification Search
CPC ........... H01L 21/67051; H01L 21/6708; H01L 21/6715; H01L 21/67259; H01L 21/681
(Continued)

(56) References Cited

U.S. PATENT DOCUMENTS

| 6,680,078 B2 | 1/2004 | Davlin .............................. 427/8 |
| 7,105,074 B2 | 9/2006 | Tamada |

(Continued)

FOREIGN PATENT DOCUMENTS

| JP | H06-111167 A | 4/1994 |
| JP | H07-333197 A | 12/1995 |

(Continued)

OTHER PUBLICATIONS

Decision to Grant a Patent dated May 29, 2018 issued in corresponding Japanese Patent Application No. 2014-254881.
(Continued)

*Primary Examiner* — Lan Vinh
(74) *Attorney, Agent, or Firm* — Ostrolenk Faber LLP

(57) ABSTRACT

An upper processing liquid nozzle moves back and forth between a processing position above a substrate held on a spin chuck and a standby position outside a processing cup. Before a processing liquid is discharged from the upper processing liquid nozzle having moved to the processing position, a camera takes a discharge standard image of an imaging region including the tip of the upper processing liquid nozzle. Then, multiple monitor target images of the imaging region taken successively by the camera are compared sequentially to the discharge standard image to determine discharge of a processing liquid from the upper processing liquid nozzle. The discharge standard image is obtained for each process on a new target substrate. This eliminates influence of a substrate surface to appear as a background both of the monitor target image and the dis-
(Continued)

charge standard image. Thus, discharge of a processing liquid can be detected reliably.

15 Claims, 26 Drawing Sheets

(58) Field of Classification Search
USPC .......... 216/84, 88, 90, 91, 92; 438/745, 750; 156/345.15, 345.17, 345.1
See application file for complete search history.

(56) References Cited

U.S. PATENT DOCUMENTS

| | | |
|---|---|---|
| 2003/0106567 A1 | 6/2003 | Anabuki |
| 2006/0029388 A1 | 2/2006 | Terada et al. ................ 396/611 |
| 2006/0090848 A1 | 5/2006 | Koga |
| 2006/0185792 A1* | 8/2006 | Yashiki ............... H01L 21/6708 156/345.17 |
| 2007/0119479 A1 | 5/2007 | Yoshihara |
| 2007/0119837 A1 | 5/2007 | Nishiya |
| 2007/0199579 A1 | 8/2007 | Hayasaki et al. ................. 134/2 |
| 2010/0098869 A1 | 4/2010 | Kinoshita .................. 427/421.1 |
| 2011/0286738 A1* | 11/2011 | Noda .................. H01L 21/6715 396/611 |
| 2013/0040062 A1* | 2/2013 | Kinoshita ............... B05B 12/08 427/421.1 |
| 2013/0084393 A1 | 4/2013 | Kashiyama et al. .......... 427/273 |
| 2013/0206726 A1 | 8/2013 | Oono |
| 2015/0262848 A1 | 9/2015 | Sano |

FOREIGN PATENT DOCUMENTS

| | | |
|---|---|---|
| JP | H10-129630 A | 5/1998 |
| JP | 11-005056 | 1/1999 |
| JP | 11005056 A | 1/1999 |
| JP | 11-329936 | 11/1999 |
| JP | 2002-316080 A | 10/2002 |
| JP | 2003-173999 A | 6/2003 |
| JP | 2003-273003 A | 9/2003 |
| JP | 2005-114500 A | 4/2005 |
| JP | 2009-032830 | 2/2009 |
| JP | 2009-095826 A | 5/2009 |
| JP | 2011-003865 A | 1/2011 |
| JP | 2011-095071 A | 5/2011 |
| JP | 2011-114138 A | 6/2011 |
| JP | 2011-146683 | 7/2011 |
| JP | 2012-009812 A | 1/2012 |
| JP | 2012-104732 A | 5/2012 |
| JP | 2012-215486 A | 11/2012 |
| JP | 2013-088924 A | 5/2013 |
| TW | 20220417 | 5/2012 |
| TW | 201311356 | 3/2013 |

OTHER PUBLICATIONS

Japanese Office Action (JP Application No. 2014-047590) dated Oct. 24, 2017 and its partial English translation.
Machine Generated English translation of JP-11005056-A held to Sanada Masakazu et al. (Year; 1999).
The Taiwanese Office Action (TW Application No. 104107817) dated Jun. 3, 2017 and Partial English Translation of the Search Report.
Office Action dated Aug. 20, 2018 issued in corresponding Taiwanese Patent Application No. 106141247 with partial English translation.
Decision to Grant a Patent dated Aug. 21, 2018 issued in corresponding Japanese Patent Application No. 2017-225756.

\* cited by examiner

F I G . 1
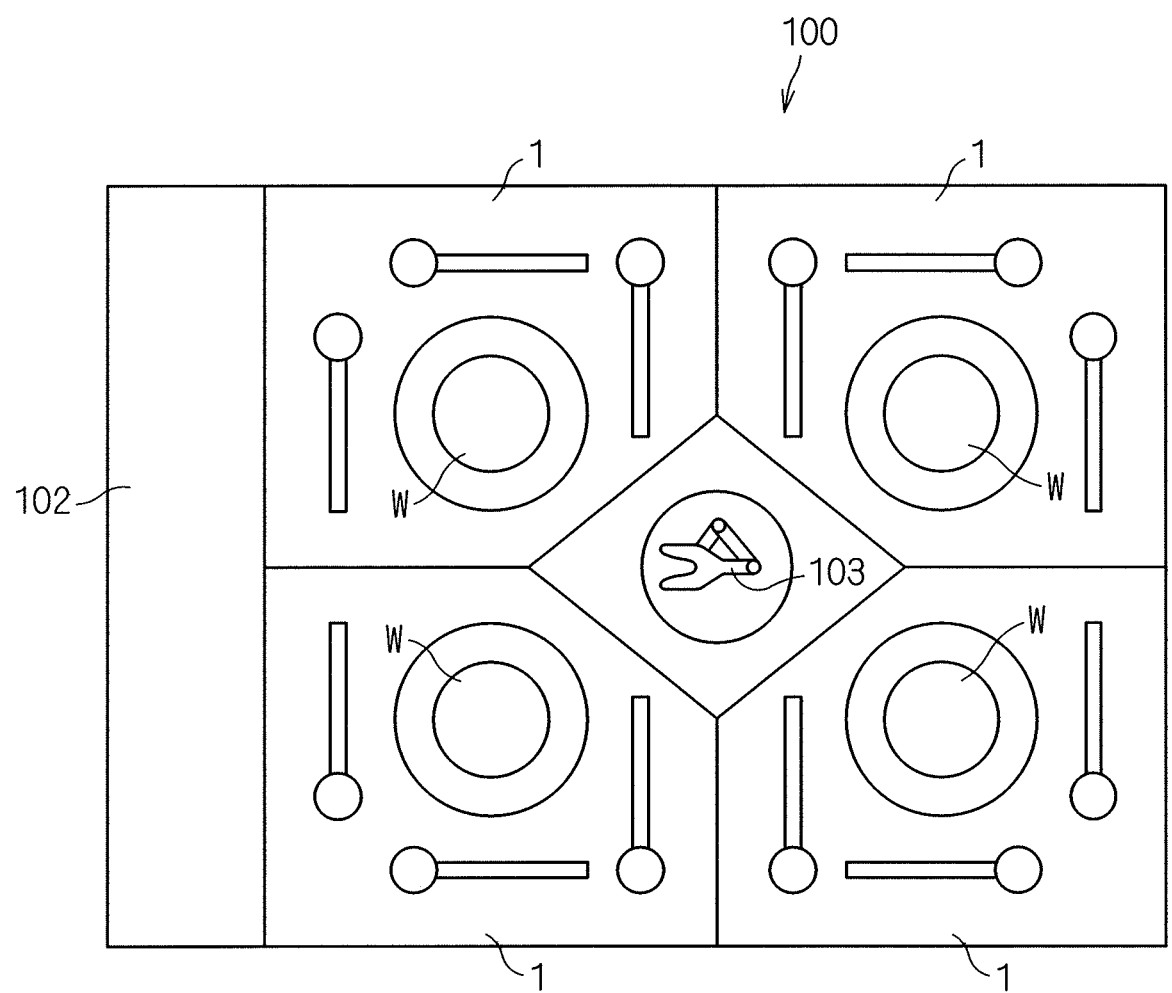

F I G . 4
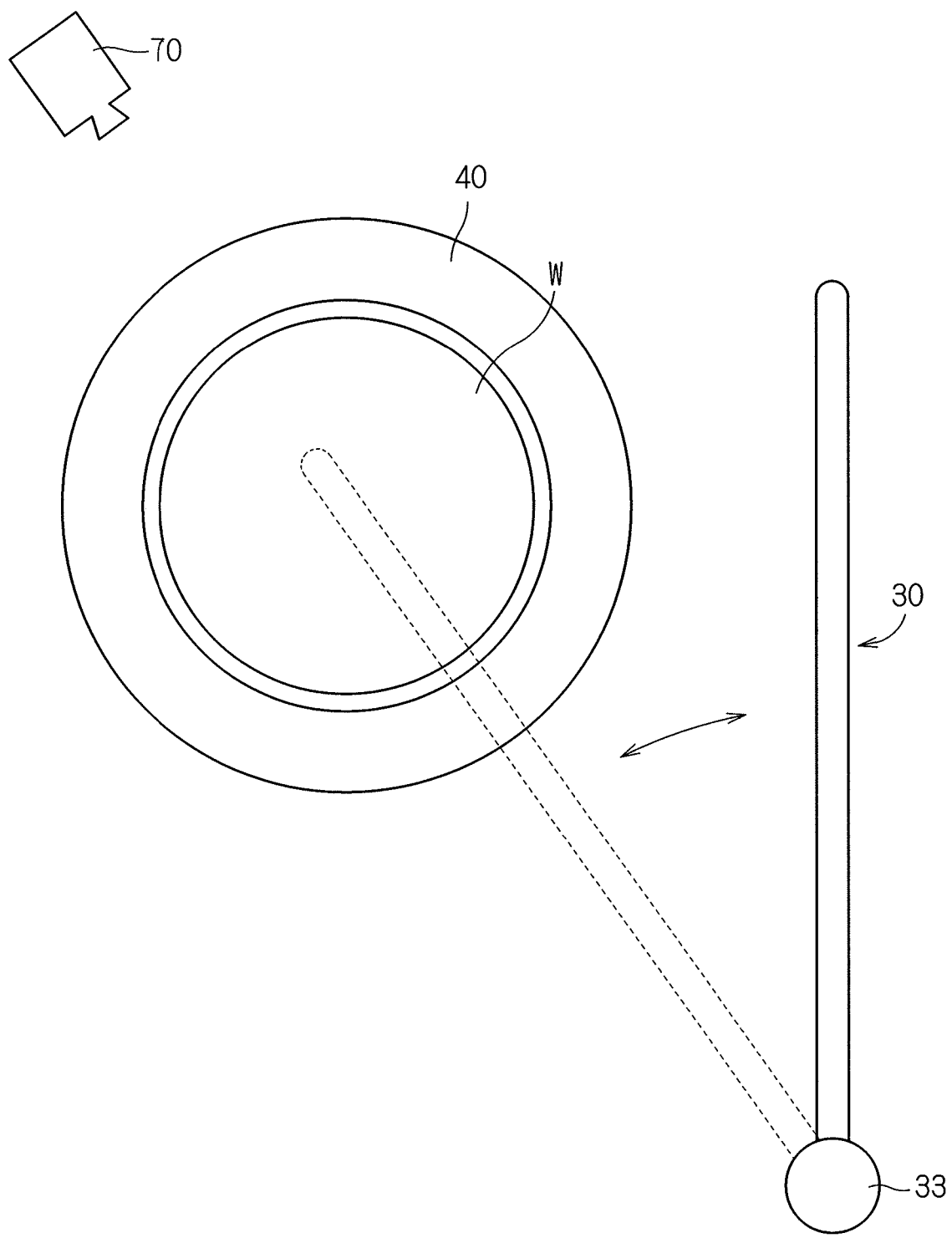

F I G. 5
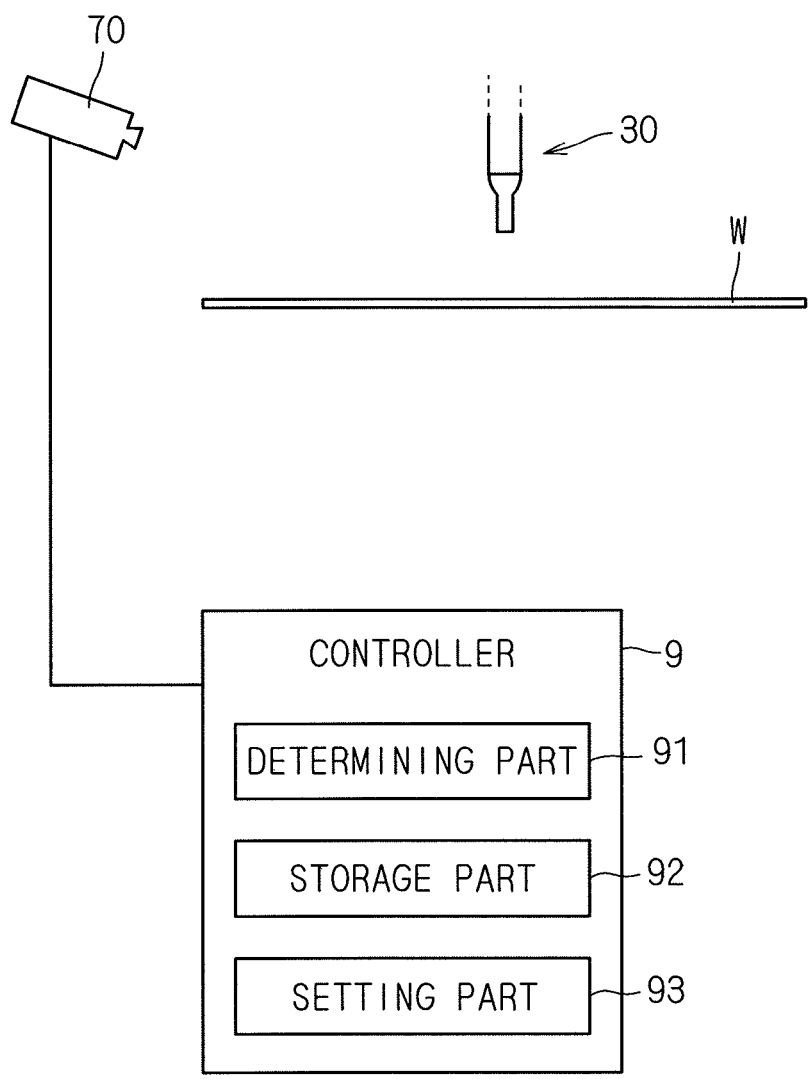

F I G . 8
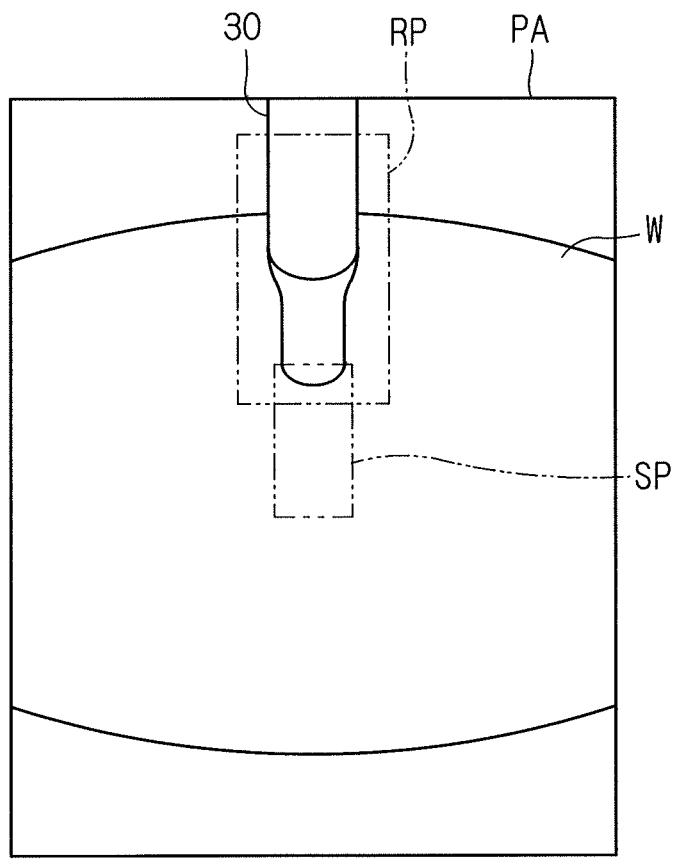

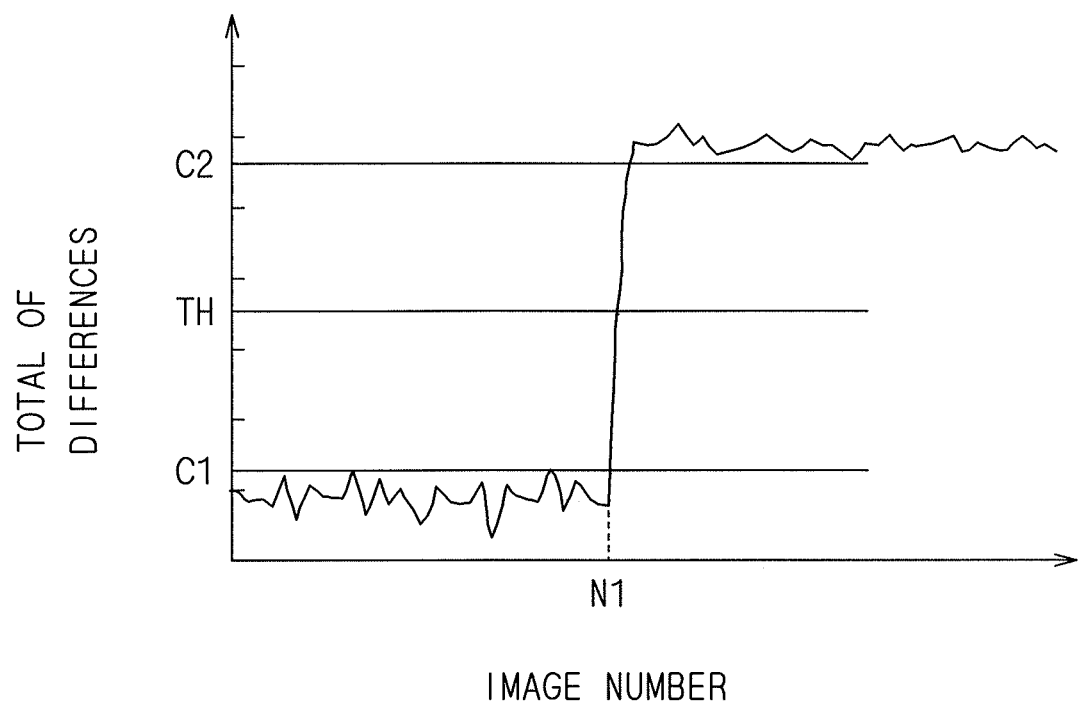
F I G . 1 8

F I G . 1 9
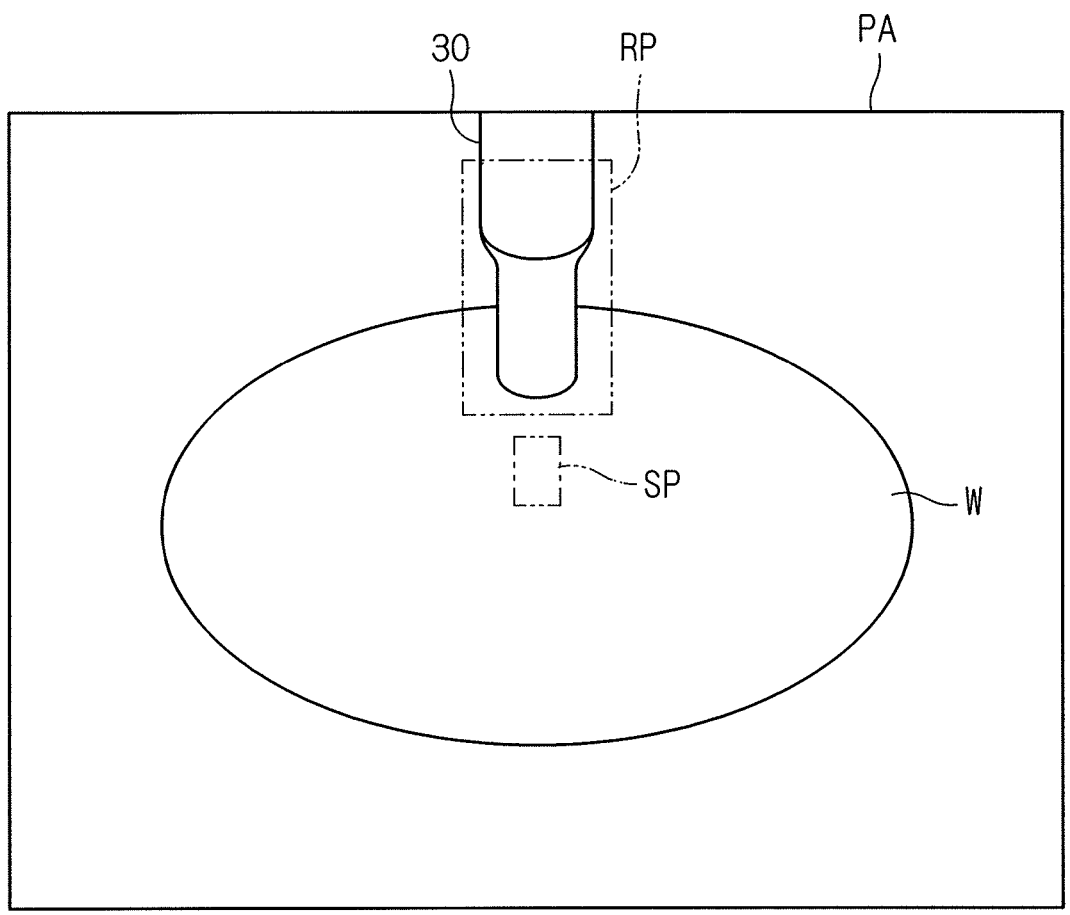

F I G . 2 3

| 95  | 99  | 102 | 100 | 83  |
|-----|-----|-----|-----|-----|
| 107 | 103 | 103 | 109 | 87  |
| 103 | 105 | 100 | 110 | 88  |
| 99  | 104 | 101 | 103 | 98  |
| 102 | 103 | 99  | 109 | 109 |
| 99  | 100 | 90  | 137 | 99  |
| 138 | 136 | 127 | 151 | 132 |
| 150 | 143 | 143 | 153 | 145 |
| 148 | 148 | 151 | 155 | 140 |
| 149 | 151 | 149 | 150 | 149 |

F I G . 2 4

| 95 | 99 | 102 | 100 | 92 |
|---|---|---|---|---|
| 107 | 103 | 103 | 109 | 104 |
| 103 | 105 | 100 | 110 | 88 |
| 99 | 104 | 101 | 103 | 98 |
| 102 | 103 | 99 | 109 | 109 |
| 99 | 100 | 90 | 103 | 99 |
| 104 | 97 | 95 | 99 | 89 |
| 102 | 100 | 103 | 104 | 105 |
| 97 | 101 | 89 | 89 | 99 |
| 100 | 101 | 98 | 106 | 110 |

F I G. 2 5
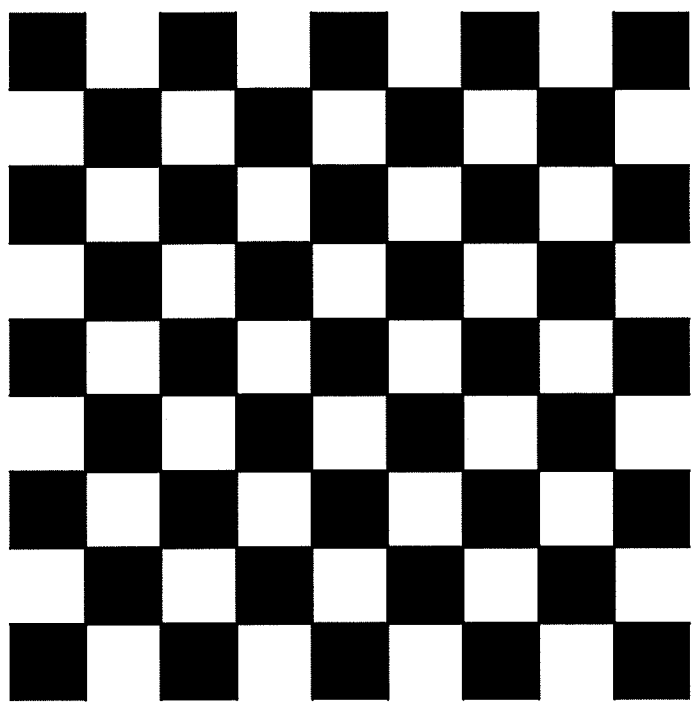

F I G . 2 6
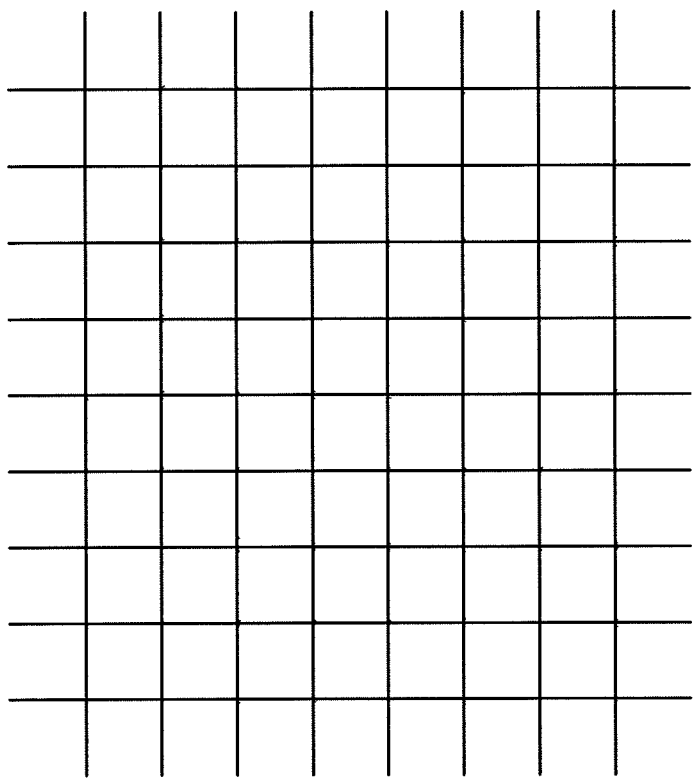

SUBSTRATE PROCESSING APPARATUS AND SUBSTRATE PROCESSING METHOD FOR DISCHARGE OF PROCESSING LIQUID FROM NOZZLE

CROSS-REFERENCE TO RELATED APPLICATIONS

The present patent application is a divisional of prior U.S. patent application Ser. No. 14/642,919, filed Mar. 10, 2015, by Hiroshi SANO and Hiroaki KAKUMA entitled "SUBSTRATE PROCESSING APPARATUS AND SUBSTRATE PROCESSING METHOD FOR DISCHARGE OF PROCESSING LIQUID FROM NOZZLE," which claims priority to Japanese Patent Application Nos. JP2014-047590, filed Mar. 11, 2014, JP2014-048807, filed Mar. 12, 2014 and JP2014-254881, filed Dec. 17, 2014. The contents of each of the patent applications listed above are incorporated in full herein by reference.

BACKGROUND OF THE INVENTION

Field of the Invention

The present invention relates to a substrate processing apparatus and a substrate processing method to perform certain process on a precision electronic substrate in the form of a semiconductor wafer or a thin plate such as a glass substrate for a liquid crystal display (hereinafter simply called a "substrate") by discharging a processing liquid from a nozzle.

Description of the Background Art

In a conventional step of manufacturing a semiconductor device and the like, various processing liquids including deionized water, a photoresist liquid, and an etching liquid are supplied to a substrate to process the substrate by cleaning or applying a resist. A substrate processing apparatus that discharges a processing liquid to a surface of a substrate while rotating the substrate in a horizontal posture has widely been used as a processing apparatus that uses such processing liquids for processing.

In such a substrate processing apparatus, whether a processing liquid is discharged from a nozzle is determined by checking the output of a flowmeter or behavior of a pump. To determine the presence or absence of the discharge more reliably, Japanese Patent Application Laid-Open No. 11-329936 (1999) suggests a technique of directly monitoring discharge of a processing liquid from a nozzle by preparing imaging means such as a CCD camera, for example.

Where discharge of a processing liquid from a nozzle is to be directly monitored by imaging means, the background of an image being taken differs depending on the type of a target substrate. Specifically, various films including a resist film and an insulating film are generally formed on a surface of a substrate to form a pattern. The reflectance of the substrate surface differs largely depending on the respective types of these films or the resultant pattern. As a result, the background of an image being taken differs depending on the type of a target substrate. Even if films of the same type are formed, etching process for example with hydrofluoric acid corrodes the films further with elapse of processing time. This may change the reflectance of the substrate surface. Thus, noise in an image taken by the imaging means may be increased for various factors including the type of a film deposited on the surface, a resultant pattern, and the substance of processing. This makes it impossible to detect discharge of a processing liquid from a nozzle correctly.

According to the technique disclosed in Japanese Patent Application Laid-Open No. 11-329936 (1999), discharge of a processing liquid from the nozzle is monitored by the imaging means. This can for example detect dripping from a nozzle while failing to detect displacement of the nozzle itself. In a substrate processing apparatus, the nozzle from which a processing liquid is discharged can generally be moved between a standby position and a processing position for example by a rotary arm. The nozzle moves to the processing position predetermined by teaching according to given timing to discharge a processing liquid from the nozzle.

Meanwhile, due to an adjustment error caused during maintenance or temporal change, a processing liquid may be discharged from the nozzle having moved to a position displaced from the processing position determined by teaching. Such displacement of the nozzle makes it impossible to achieve an originally expected processing result.

SUMMARY OF THE INVENTION

The present invention is intended for a substrate processing apparatus for discharging a processing liquid to a substrate.

According to one aspect of this invention, the substrate processing apparatus includes: a substrate holder that holds a substrate; a cup surrounding the substrate holder; a nozzle from which a processing liquid is discharged; a driving part that moves the nozzle between a processing position above a substrate held by the substrate holder and a standby position outside the cup; an imaging part that takes an image of an imaging region including a tip of the nozzle placed in the processing position; and a determining part that determines discharge of a processing liquid from the nozzle by comparing a first standard image and a monitor target image. The first standard image is an image of the imaging region taken by the imaging part before a processing liquid is discharged from the nozzle having moved to the processing position. The monitor target image is an image of the imaging region taken thereafter by the imaging part. The imaging part obtains the first standard image each time the substrate holder holds a new target substrate and the nozzle moves to the processing position.

Discharge of a processing liquid from the nozzle is determined by comparing the first standard image of the imaging region taken by the imaging part before a processing liquid is discharged from the nozzle having moved to the processing position and the monitor target image of the imaging region taken thereafter by the imaging part. The first standard image is obtained each time the substrate holder holds a new target substrate and the nozzle moves to the processing position. Thus, the first standard image and the monitor target image are to include the same image of a surface of a substrate as a background. This eliminates the influence of the reflectance of a substrate surface. As a result, discharge of a processing liquid from the nozzle can be detected reliably independently of the type of a target substrate.

Preferably, the substrate processing apparatus further includes a storage part that stores a determination region set in an image of the imaging region taken by the imaging part. The determination region includes a part of a region from the tip of the nozzle to a substrate held by the substrate holder. The determining part determines that a processing liquid is discharged from the nozzle if a difference between the determination region in the first standard image and the determination region in the monitor target image is a given threshold or more.

The first standard image and the monitor target image can be compared while influence of an image for example of an object reflected at a substrate surface is eliminated.

Preferably, the imaging part takes images of the imaging region successively at given intervals from a point in time when the substrate holder holds a new target substrate and the nozzle starts moving from the standby position toward the processing position. The determining part determines that the nozzle has stopped moving if a difference between successive images of the imaging region taken successively by the imaging part is a fixed value or less.

Stop of movement of the nozzle can be determined automatically.

Preferably, the determining part performs normalization by the area of the determination region for comparison between the first standard image and the monitor target images.

The threshold can be fixed irrespective of the size of the determination region.

Preferably, the determining part determines that a processing liquid is discharged from the nozzle if a moving average of respective differences of monitor target images of a given number from the first standard image is a given threshold or more.

Influence of noise can be relaxed during image taking.

Preferably, the determining part determines position abnormality of the nozzle in the processing position by comparing a second standard image and the first standard image. The second standard image is an image of the imaging region taken by the imaging part when the nozzle is placed in the processing position correctly.

Not only discharge of a processing liquid but also position abnormality of the nozzle can be determined.

Preferably, the determining part moves the position of the determination region in the first standard image and that of the determination region in the monitor target image based on a result of comparison between the second and first standard images.

The determination region can be set correctly even if the nozzle stops at a position displaced slightly from the proper processing position.

According to a different aspect of this invention, the substrate processing apparatus includes: a substrate holder that holds a substrate; a cup surrounding the substrate holder; a nozzle from which a processing liquid is discharged; a driving part that moves the nozzle between a processing position above a substrate held by the substrate holder and a standby position outside the cup; an imaging part that takes an image of an imaging region including a tip of the nozzle placed in the processing position; a setting part that specifies the coordinate of the nozzle in a position standard image and sets a rectangular region including the tip of the nozzle as a reference pattern, the position standard image being an image of the imaging region taken by the imaging part when the nozzle is placed in the processing position correctly; and a determining part that determines position abnormality of the nozzle in the processing position by comparing an image of a partial region to the reference pattern in the position standard image. The image of the partial region corresponds to the reference pattern and is a part of an image of the imaging region taken by the imaging part when the substrate holder holds a target substrate and the nozzle has moved to the processing position.

The coordinate of the nozzle in the position standard image is specified and a rectangular region including the tip of the nozzle is set as a reference pattern. The position standard image is an image taken when the nozzle is placed in the processing position correctly. Position abnormality of the nozzle in the processing position is determined by comparing an image of a partial region to the reference pattern in the position standard image. The image of the partial region corresponds to the reference pattern and is a part of an image taken when the substrate holder holds a target substrate and the nozzle has moved to the processing position. As a result, displacement of the nozzle can be detected.

Preferably, the setting part sets the discharge determination region including a columnar part of a processing liquid discharged from the tip of the nozzle to reach a substrate held by the substrate holder in the position standard image based on a discharge width of the nozzle and a distance between the tip of the nozzle and the substrate held by the substrate holder. The determining part determines discharge of a processing liquid from the nozzle by comparing the discharge determination region in a discharge standard image and the discharge determination region in a monitor target image. The discharge standard image is an image of the imaging region taken by the imaging part before a processing liquid is discharged from the nozzle having moved to the processing position. The monitor target image is an image of the imaging region taken thereafter by the imaging part.

Not only displacement of the nozzle but also the presence or absence of discharge of a processing liquid from the nozzle can be determined.

According to a different aspect of this invention, the substrate processing apparatus includes: a chamber that houses a substrate; a substrate holder that holds a substrate in the chamber; a cup surrounding the substrate holder; a nozzle from which a processing liquid is discharged; a driving part that moves the nozzle between a processing position above a substrate held by the substrate holder and a standby position outside the cup; an imaging part that takes an image of a determination region, a processing liquid appearing in the image of the determination region when the processing liquid is discharged from the nozzle in the processing position, a surface of a substrate held by the substrate holder appearing in the image of the determination region when discharge of a processing liquid from the nozzle stops; and a determining part that determines discharge of a processing liquid from the nozzle based on a determination image of the determination region taken by the imaging part. The determining part determines that a processing liquid is discharged from the nozzle if a dispersion of the brightness levels of pixels in the determination image is smaller than a given threshold and that a processing liquid is not discharged from the nozzle if the dispersion is larger than the threshold.

A processing liquid is determined to be discharged from the nozzle if a dispersion of the brightness levels of pixels in the determination image taken as an image of the determination region is smaller than the given threshold. A processing liquid is determined not to be discharged from the nozzle if the dispersion is larger than the threshold. Thus, discharge of a processing liquid from the nozzle can be determined only with the determination image and can be detected reliably.

Preferably, the imaging part takes multiple determination images of the determination region successively. The determining part determines that a processing liquid is discharged from the nozzle if the dispersion continues to be smaller than the threshold about determination images of a given number out of the multiple determination images.

Discharge of a processing liquid from the nozzle can be detected stably and reliably.

Preferably, a pattern is formed on an area inside the chamber to be reflected at a surface of a substrate held by the substrate holder and targeted for image taking by the imaging part when discharge of a processing liquid from the nozzle stops.

A dispersion of the determination image in the absence of discharge of a processing liquid can be increased significantly to prevent erroneous determination.

The present invention is also intended for a substrate processing method of discharging a processing liquid to a substrate.

According to one aspect of this invention, the substrate processing method includes the steps of: (a) holding a new target substrate with a substrate holder; (b) after the new target substrate is held by the substrate holder, moving a nozzle from which a processing liquid is discharged from a standby position outside a cup surrounding the substrate holder toward a processing position above the substrate held by the substrate holder; (c) taking an image of an imaging region including a tip of the nozzle placed in the processing position with an imaging part; and (d) determining discharge of a processing liquid from the nozzle by comparing a first standard image and a monitor target image. The first standard image is an image of the imaging region taken by the imaging part before a processing liquid is discharged from the nozzle having moved to the processing position. The monitor target image is an image of the imaging region taken thereafter by the imaging part. In the step (c), the first standard image is obtained each time the substrate holder holds a new target substrate and the nozzle moves to the processing position.

Discharge of a processing liquid from the nozzle is determined by comparing the first standard image of the imaging region taken by the imaging part before a processing liquid is discharged from the nozzle having moved to the processing position and the monitor target image of the imaging region taken thereafter by the imaging part. The first standard image is obtained each time the substrate holder holds a new target substrate and the nozzle moves to the processing position. Thus, the first standard image and the monitor target image are to include the same image of a surface of a substrate as a background. This eliminates the influence of the reflectance of a substrate surface. As a result, discharge of a processing liquid from the nozzle can be detected reliably independently of the type of a target substrate.

Preferably, a determination region is set in advance in an image of the imaging region taken by the imaging part. The determination region includes a part of a region from the tip of the nozzle to a substrate held by the substrate holder. In the step (d), a processing liquid is determined to be discharged from the nozzle if a difference between the determination region in the first standard image and the determination region in the monitor target image is a given threshold or more.

The first standard image and the monitor target image can be compared while influence of an image for example of an object reflected at a substrate surface is eliminated.

Preferably, in the step (c), images of the imaging region are taken successively at given intervals from a point in time when the substrate holder holds a new target substrate and the nozzle starts moving from the standby position toward the processing position. The nozzle is determined to have stopped moving if a difference between successive images of the imaging region taken successively by the imaging part is a fixed value or less.

Stop of movement of the nozzle can be determined automatically.

Preferably, in the step (d), normalization by the area of the determination region is performed for comparison between the first standard image and the monitor target images.

The threshold can be fixed irrespective of the size of the determination region.

Preferably, in the step (d), a processing liquid is determined to be discharged from the nozzle if a moving average of respective differences of monitor target images of a given number from the first standard image is a given threshold or more.

Influence of noise can be relaxed during image taking.

Preferably, position abnormality of the nozzle in the processing position is determined by comparing a second standard image and the first standard image. The second standard image is an image of the imaging region taken by the imaging part when the nozzle is placed in the processing position correctly.

Not only discharge of a processing liquid but also position abnormality of the nozzle can be determined.

Preferably, in the step (d), the position of the determination region in the first standard image and that of the determination region in the monitor target image are moved based on a result of comparison between the second and first standard images.

The determination region can be set correctly even if the nozzle stops at a position displaced slightly from the proper processing position.

According to a different aspect of this invention, the substrate processing method includes the steps of: (a) specifying the coordinate of a nozzle from which a processing liquid is discharged in a position standard image and setting a rectangular region including a tip of the nozzle as a reference pattern, the position standard image being an image of an imaging region including the tip of the nozzle in a processing position taken by an imaging part when the nozzle is placed in the processing position correctly, the processing position being above a substrate to be held by a substrate holder; and (b) determining position abnormality of the nozzle in the processing position by comparing an image of a partial region to the reference pattern in the position standard image. The image of the partial region corresponds to the reference pattern and is a part of an image of the imaging region taken by the imaging part when the substrate holder holds a target substrate and the nozzle has moved from a standby position outside a cup surrounding the substrate holder to the processing position.

The coordinate of the nozzle in the position standard image is specified and a rectangular region including the tip of the nozzle is set as a reference pattern. The position standard image is an image taken when the nozzle from which a processing liquid is discharged is placed in the processing position correctly above a substrate to be held by the substrate holder. Position abnormality of the nozzle in the processing position is determined by comparing an image of a partial region to the reference pattern in the position standard image. The image of the partial region corresponds to the reference pattern and is a part of an image taken when the substrate holder holds a target substrate and the nozzle has moved to the processing position. As a result, displacement of the nozzle can be detected.

Preferably, the substrate processing method further includes the steps of: (c) setting a discharge determination region including a columnar part of a processing liquid discharged from the tip of the nozzle to reach a substrate held by the substrate holder in the position standard image based on a discharge width of the nozzle and a distance between the tip of the nozzle and the substrate held by the substrate holder; and (d) determining discharge of a processing liquid from the nozzle by comparing the discharge determination region in a discharge standard image and the discharge determination region in a monitor target image. The discharge standard image is an image of the imaging region taken by the imaging part before a processing liquid is discharged from the nozzle having moved to the processing position. The monitor target image is an image of the imaging region taken thereafter by the imaging part.

Not only displacement of the nozzle but also the presence or absence of discharge of a processing liquid from the nozzle can be determined.

Preferably, the substrate processing method further includes the steps of: (f) storing the image of the imaging region used in the step (e) and taken by the imaging part when a processing liquid is not discharged from the nozzle and the image of the imaging region used in the step (e) and taken by the imaging part when a processing liquid is discharged from the nozzle; and (g) verifying the discharge determination region set in the step (c) and the threshold set in the step (e) using the images stored in the step (f).

The validity of the discharge determination region and that of the threshold can be examined without the need for actually discharging a processing liquid from the nozzle to a substrate.

According to a different aspect of this invention, the substrate processing method includes the steps of: (a) transporting a new target substrate into a chamber and holding the substrate with a substrate holder; (b) after the new target substrate is held by the substrate holder, moving a nozzle from which a processing liquid is discharged from a standby position outside a cup surrounding the substrate holder toward a processing position above the substrate held by the substrate holder; (c) taking an image of a determination region, a processing liquid appearing in the image of the determination region when the processing liquid is discharged from the nozzle in the processing position, a surface of the substrate held by the substrate holder appearing in the image of the determination region when discharge of a processing liquid from the nozzle stops; and (d) determining discharge of a processing liquid from the nozzle based on a determination image of the determination region taken in the step (c). In the step (d), a processing liquid is determined to be discharged from the nozzle if a dispersion of the brightness levels of pixels in the determination image is smaller than a given threshold and a processing liquid is determined not to be discharged from the nozzle if the dispersion is larger than the threshold.

A processing liquid is determined to be discharged from the nozzle if a dispersion of the brightness levels of pixels in the determination image taken as an image of the determination region is smaller than the given threshold. A processing liquid is determined not to be discharged from the nozzle if the dispersion is larger than the threshold. Thus, discharge of a processing liquid from the nozzle can be determined only with the determination image and can be detected reliably.

Preferably, in the step (c), multiple determination images of the determination region are taken successively. In the step (d), a processing liquid is determined to be discharged from the nozzle if the dispersion continues to be smaller than the threshold about determination images of a given number out of the multiple determination images.

Discharge of a processing liquid from the nozzle can be detected stably and reliably.

Thus, it is an object of the present invention to detect discharge of a processing liquid from the nozzle reliably independently of the type of a target substrate.

It is a different aspect of the present invention to detect displacement of the nozzle.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 shows an overall structure of a substrate processing apparatus according to the present invention;

FIG. 4 shows the position of a camera and that of an upper processing liquid nozzle relative to each other;

FIG. 5 is a block diagram showing a camera and a controller;

FIG. 8 shows an example of an image of an imaging region including the tip of the upper processing liquid nozzle in a processing position taken by the camera;

FIG. 18 explains setting of a threshold for discharge determination;

FIG. 19 shows an example of an image of the imaging region including the tip of the upper processing liquid nozzle in the processing position taken by the camera;

FIG. 23 shows examples of the brightness levels of pixels in the image for determination taken in the absence of discharge of a processing liquid;

FIG. 24 shows examples of the brightness levels of pixels in the image for determination taken in the presence of discharge of a processing liquid; and FIGS. 25, 26, and 27 show respective examples of a pattern formed inside a chamber.

DESCRIPTION OF THE PREFERRED EMBODIMENTS

Figure 2:
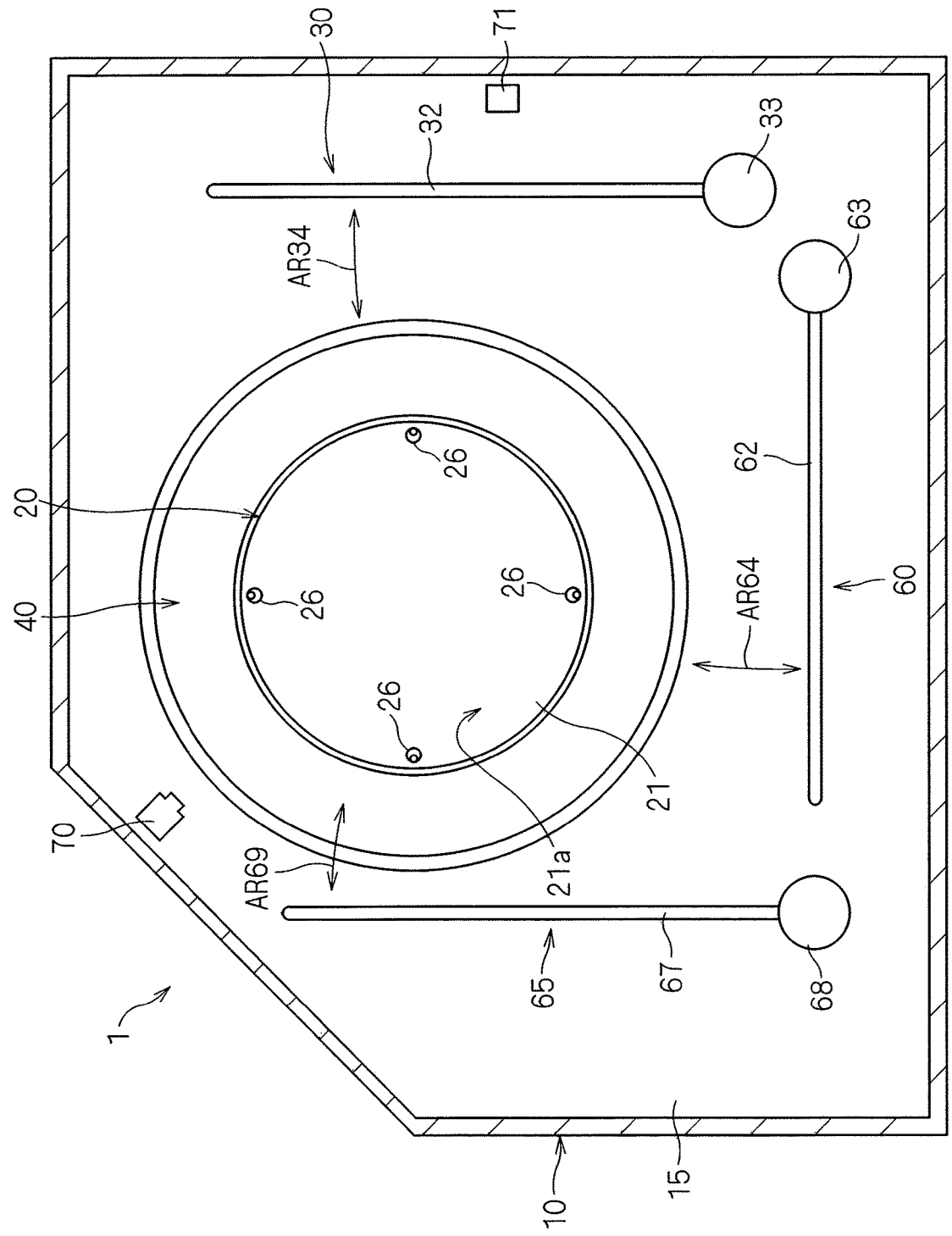
FIG. 2 is a plan view of a cleaning unit.

Preferred embodiments of the present invention are described in detail below by referring to the accompanying drawings.

<First Preferred Embodiment>

FIG. 1 shows an overall structure of a substrate processing apparatus 100 according to the present invention. The substrate processing apparatus 100 is a single-wafer processing apparatus to process substrates W for semiconductor purposes one by one. The substrate processing apparatus 100 cleans a circular silicon substrate W with a chemical liquid and deionized water and then dries the substrate W. Examples of the chemical liquid typically include an SC1 liquid (mixed liquid of ammonia water, hydrogen peroxide water, and water), an SC2 liquid (mixed liquid of hydrochloric acid, hydrogen peroxide water, and water), and a DHF liquid (buffered hydrofluoric acid). In this specification, the chemical liquid and deionized water are collectively called a "processing liquid." The "processing liquid" of the present invention includes not only liquids for purposes of cleaning but also a coating liquid such as a photoresist liquid to be used for film deposition, a chemical liquid to be used for removal of an unnecessary film, and a chemical liquid to be used for etching, for example.

The substrate processing apparatus 100 includes an indexer 102, multiple cleaning units 1, and a main transport robot 103. The indexer 102 functions to transport an unprocessed substrate W received from the outside of the apparatus into the apparatus and to transport a processed substrate W after being cleaned to the outside of the apparatus. The indexer 102 includes multiple carriers placed therein and a transfer robot (all of which are not shown in the drawings). The carrier can be a publicly-known FOUP (front opening unified pod), a publicly-known SMIF (standard mechanical interface) pod, or a publicly-known OC (open cassette) to expose a substrate W housed therein to external air. The transfer robot transfers a substrate W between the carrier and the main transport robot 103.

Twelve cleaning units 1 are arranged in the substrate processing apparatus 100. The arrangement is described in detail as follows. Four towers each including three stacked cleaning units 1 are arranged to surround the main transport robot 103. In other words, four cleaning units 1 are arranged to surround the main transport robot 103 and these four cleaning units 1 are stacked in three tiers. FIG. 1 shows one of these tiers. The number of the cleaning units 1 provided in the substrate processing apparatus 100 is not limited to 12 but it may alternatively be eight or four, for example.

The main transport robot 103 is arranged in the center of the four towers each including the stacked cleaning units 1. The main transport robot 103 transports an unprocessed substrate W received from the indexer 102 to each cleaning unit 1. The main transport robot 103 takes a processed substrate W out of each cleaning unit 1 and transfers the processed substrate W to the indexer 102.

Figure 3:
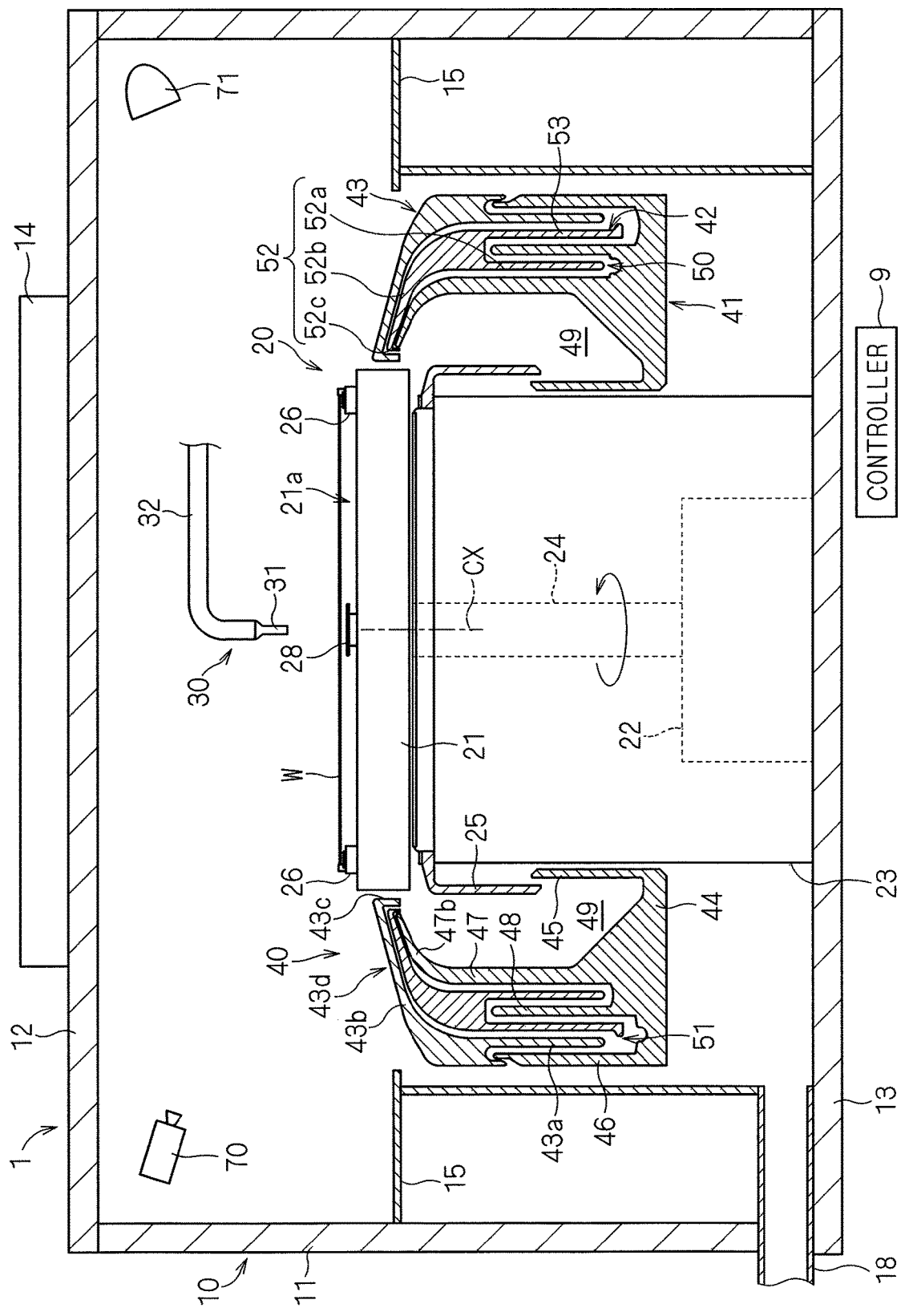
FIG. 3 is a vertical sectional view of the cleaning unit.

The cleaning units 1 are described next. The following describes one of the 12 cleaning units 1 provided in the substrate processing apparatus 100. The following description is entirely applicable to the other cleaning units 1. FIG. 2 is a plan view of the cleaning unit 1. FIG. 3 is a vertical sectional view of the cleaning unit 1. FIG. 2 shows a state where a substrate W is not held on a spin chuck 20. FIG. 3 shows a state where a substrate W is held on the spin chuck 20.

Main components of the substrate processing apparatus 100 housed in a chamber 10 include the spin chuck 20 on which a substrate W is held in a horizontal posture (posture that makes the normal of the substrate W extend in the vertical direction), three upper processing liquid nozzles 30, 60, and 65 from which a processing liquid is supplied to the upper surface of a substrate W held on the spin chuck 20, a processing cup 40 surrounding the spin chuck 20, and a camera 70 that takes an image of space above the spin chuck 20. A partition plate 15 is provided around the processing cup 40 in the chamber 10. The partition plate 15 divides the space inside the chamber 10 into parts, one above the other.

The chamber 10 has a side wall 11 extending in the vertical direction, a ceiling wall 12 enclosing space from above surrounded by the side wall 11, and a floor wall 13 enclosing the space from below. The space surrounded by the side wall 11, the ceiling wall 12, and the floor wall 13 functions as processing space for a substrate W. A part of the side wall 11 of the chamber 10 is given a port through which a substrate W is transported into the chamber 10 and out of the chamber 10 by the main transport robot 103, and a shutter to open and close the port (both the port and the shutter are not shown in the drawings).

The ceiling wall 12 of the chamber 10 is provided with a fan filter unit (FFU) 14 that improves the cleanness of air in a clean room where the substrate processing apparatus 100 is placed and supplies the cleaned air into the processing space in the chamber 10. The fan filter unit 14 includes a fan for taking in the air inside the clean room and feeding the air into the chamber 10 and a filter (such as a HEPA filter). The fan filter unit 14 forms a downflow of the cleaned air in the processing space in the chamber 10. A punching plate with many blowholes may be provided directly below the ceiling wall 12 in order to realize uniform distribution of the cleaned air supplied from the fan filter unit 14.

The spin chuck 20 includes a spin base 21 in the form of a circular disk fixed in a horizontal posture to the upper end of a rotary shaft 24 extending in the vertical direction. A spin motor 22 to rotate the rotary shaft 24 is provided below the spin base 21. The spin motor 22 rotates the spin base 21 in a horizontal plane through the rotary shaft 24. A cylindrical cover member 23 is provided so as to surround the spin motor 22 and the rotary shaft 24.

The outer diameter of the spin base 21 in the form of a circular disk is slightly larger than the diameter of a circular substrate W held on the spin chuck 20. This forms a holding surface 21a of the spin base 21 facing the entire lower surface of a substrate W to be held.

Multiple (in the first preferred embodiment, four) chuck pins 26 are provided in upright positions at a peripheral part of the holding surface 21a of the spin base 21. The chuck pins 26 are uniformly spaced (if four chuck pins 26 are provided as in the first preferred embodiment, they are spaced at intervals of 90 degrees) along a circumference corresponding to the outer circumference of a circular substrate W. The chuck pins 26 are driven in synchronization with each other by a link mechanism not shown in the drawings housed in the spin base 21. The spin chuck 20 can make abutting contact of each of the chuck pins 26 with a corresponding peripheral edge of a substrate W to grasp the substrate W, thereby holding the substrate W in a horizontal posture above the spin base 21 and near the holding surface 21a (see FIG. 3). The spin chuck 20 can also separate each of the chuck pins 26 from a corresponding peripheral edge of a substrate W, thereby releasing the substrate W from the grasp.

The cover member 23 covering the spin motor 22 has a lower end fixed to the floor wall 13 of the chamber 10 and an upper end reaching as far as a position directly below the spin base 21. An upper end portion of the cover member 23 is provided with a flange member 25 projecting in a substantially horizontal position outward of the cover member 23 and further bending downward. While the spin chuck 20 holds a substrate W while grasping the substrate W with the chuck pins 26, the spin motor 22 rotates the rotary shaft 24, thereby allowing the substrate W to rotate about a rotation axis CX extending in the vertical direction and passing through the center of the substrate W. A controller 9 controls drive of the spin motor 22.

The upper processing liquid nozzle 30 is formed of a discharge head 31 attached to the tip of a nozzle arm 32. A base end of the nozzle arm 32 is fixedly coupled to a nozzle base 33. A motor not shown in the drawings allows the nozzle base 33 to rotate around an axis extending in the vertical direction. Rotation of the nozzle base 33 moves the upper processing liquid nozzle 30 in an arcuate pattern in the horizontal direction between a processing position above the spin chuck 20 and a standby position outside the processing cup 40 as shown by an arrow AR34 of FIG. 2. The upper processing liquid nozzle 30 is configured so as to receive processing liquids of several types (including at least deionized water). A processing liquid discharged from the discharge head 31 of the upper processing liquid nozzle 30 in the processing position reaches the upper surface of a substrate W held on the spin chuck 20. Rotation of the nozzle base 33 allows the upper processing liquid nozzle 30 to swing above the holding surface 21a of the spin base 21.

The cleaning unit 1 of the first preferred embodiment includes the two upper processing liquid nozzles 60 and 65 in addition to the aforementioned upper processing liquid nozzle 30. The upper processing liquid nozzles 60 and 65 of the first preferred embodiment have the same structure as the aforementioned upper processing liquid nozzle 30. Specifically, the upper processing liquid nozzle 60 is formed of a discharge head attached to the tip of a nozzle arm 62. A nozzle base 63 coupled to a base end of the nozzle arm 62 moves the upper processing liquid nozzle 60 in an arcuate pattern between a processing position above the spin chuck 20 and a standby position outside the processing cup 40 as shown by an arrow AR64. Likewise, the upper processing liquid nozzle 65 is formed of a discharge head attached to the tip of a nozzle arm 67. A nozzle base 68 coupled to a base end of the nozzle arm 67 moves the upper processing liquid nozzle 65 in an arcuate pattern between a processing position above the spin chuck 20 and a standby position outside the processing cup 40 as shown by an arrow AR69. Each of the upper processing liquid nozzles 60 and 65 is also configured so as to receive processing liquids of several types including at least deionized water. A processing liquid is discharged from each of the upper processing liquid nozzles 60 and 65 in the processing position to the upper surface of a substrate W held on the spin chuck 20. At least one of the upper processing liquid nozzles 60 and 65 may be a two-fluid nozzle to generate droplets of a mixture of a cleaning liquid such as deionized water and pressurized gas and to spray the mixed fluid of the droplets and the gas to a substrate W. The number of nozzles provided in the cleaning unit 1 is not limited to three but it is only required to be one or more.

A lower processing liquid nozzle 28 is provided that extends in the vertical direction so as to pass through the inside of the rotary shaft 24. An opening at the upper end of the lower processing liquid nozzle 28 is placed in a position facing the center of the lower surface of a substrate W held on the spin chuck 20. The lower processing liquid nozzle 28 is also configured so as to receive processing liquids of several types. A processing liquid discharged from the lower processing liquid nozzle 28 reaches the lower surface of a substrate W held on the spin chuck 20.

The processing cup 40 surrounding the spin chuck 20 includes an inner cup 41, a middle cup 42, and an outer cup 43 that are capable of moving up and down independently of each other. The inner cup 41 has a shape surrounding the spin chuck 20 and exhibiting substantially rotational symmetry about the rotation axis CX passing through the center of a substrate W held on the spin chuck 20. The inner cup 41 has the following sections formed integrally: a bottom section 44 having a toroidal shape in plan view; a cylindrical inner wall section 45 extending upward from an inner periphery of the bottom section 44; a cylindrical outer wall section 46 extending upward from an outer periphery of the bottom section 44; a first guide section 47 extending upward from a position between the inner and outer wall sections 45 and 46 and having an upper end portion that extends obliquely upward in the pattern of a smooth circular arc toward the center (in a direction to get closer to the rotation axis CX of a substrate W held on the spin chuck 20); and a cylindrical middle wall section 48 extending upward from a position between the first guide section 47 and the outer wall section 46.

The inner wall section 45 has a length that places the inner wall section 45 between the cover member 23 and the flange member 25 with appropriate clearance left therebetween when the inner cup 41 is at its highest position. The middle wall section 48 has a length that places the middle wall section 48 between a second guide section 52 and a processing liquid dividing wall 53 of the middle cup 42 described later with appropriate clearance left therebetween when the inner and middle cups 41 and 42 are in their closest positions.

The first guide section 47 has an upper end portion 47b that extends obliquely upward in the pattern of a smooth circular arc toward the center (in a direction to get closer to the rotation axis CX of a substrate W). A disposal slot 49 is formed between the inner wall section 45 and the first guide section 47 in which a used processing liquid is collected and disposed of. A toroidal inner recovery slot 50 is formed between the first guide section 47 and the middle wall section 48 in which a used processing liquid is collected and recovered. Further, a toroidal outer recovery slot 51 is formed between the middle and outer wall sections 48 and 46 in which a processing liquid of a type different from that collected in the inner recovery slot 50 is collected and recovered.

The disposal slot 49 is connected to a discharge mechanism not shown in the drawings that discharges a processing liquid collected in the disposal slot 49 and forcibly extracts air from the disposal slot 49. As an example, four discharge mechanisms are provided that are uniformly spaced in the circumferential direction of the disposal slot 49. Further, respective recovery mechanisms (both of which are not shown in the drawings) are connected to the inner and outer recovery slots 50 and 51 by which respective processing liquids collected in the inner and outer recovery slots 50 and 51 are recovered in a recovery tank provided outside the substrate processing apparatus 100. Respective bottom portions of the inner and outer recovery slots 50 and 51 are tilted at slight angles with respect to the horizontal direction. The respective recovery mechanisms are connected to the lowest positions of these bottom portions. This allows smooth recovery of respective processing liquids flowing into the inner and outer recovery slots 50 and 51.

The middle cup 42 has a shape surrounding the spin chuck 20 and exhibiting substantially rotational symmetry about the rotation axis CX passing through the center of a substrate W held on the spin chuck 20. The middle cup 42 has the following sections formed integrally: the second guide section 52; and the cylindrical processing liquid dividing wall 53 coupled to the second guide section 52.

The second guide section 52 is placed outside the first guide section 47 of the inner cup 41. The second guide section 52 has a cylindrical lower end portion 52*a* coaxial with a lower end portion of the first guide section 47, an upper end portion 52*b* extending obliquely upward from the upper end of the lower end portion 52*a* in the pattern of a smooth circular arc toward the center (in a direction to get closer to the rotation axis CX of a substrate W), and a bent portion 52*c* formed by bending the tip of the upper end portion 52*b* downward. The lower end portion 52*a* is placed in the inner recovery slot 50 with appropriate clearance left between the first guide section 47 and the middle wall section 48 when the inner and middle cups 41 and 42 are in their closest positions. The upper end portion 52*b* is arranged to cover the upper end portion 47*b* of the first guide section 47 of the inner cup 41 from above. The upper end portion 52*b* is close to the upper end portion 47*b* of the first guide section 47 with slight clearance left therebetween when the inner and middle cups 41 and 42 are in their closest positions. The bent portion 52*c* formed by bending the tip of the upper end portion 52*b* downward has a length that makes the bent portion 52*c* cover the tip of the upper end portion 47*b* of the first guide section 47 from the side when the inner and middle cups 41 and 42 are in their closest positions.

The upper end portion 52*b* of the second guide section 52 becomes thicker with approach toward its bottom. The processing liquid dividing wall 53 has a cylindrical shape extending downward from a peripheral portion at the lower end of the upper end portion 52*b*. The processing liquid dividing wall 53 is placed in the outer recovery slot 51 with appropriate clearance left between the middle wall section 48 and the outer cup 43 when the inner and middle cups 41 and 42 are in their closest positions.

The outer cup 43 is provided outside the second guide section 52 of the middle cup 42. The outer cup 43 has a shape surrounding the spin chuck 20 and exhibiting substantially rotational symmetry about the rotation axis CX passing through the center of a substrate W held on the spin chuck 20. The outer cup 43 functions as a third guide section. The outer cup 43 has a cylindrical lower end portion 43*a* coaxial with the lower end portion 52*a* of the second guide section 52, an upper end portion 43*b* extending obliquely upward from the upper end of the lower end portion 43*a* in the pattern of a smooth circular arc toward the center (in a direction to get closer to the rotation axis CX of a substrate W), and a bent portion 43*c* formed by bending the tip of the upper end portion 43*b* downward.

The lower end portion 43*a* is placed in the outer recovery slot 51 with appropriate clearance left between the processing liquid dividing wall 53 of the middle cup 42 and the outer wall section 46 of the inner cup 41 when the inner and outer cups 41 and 43 are in their closest positions. The upper end portion 43*b* is arranged to cover the second guide section 52 of the middle cup 42 from above. The upper end portion 43*b* is close to the upper end portion 52*b* of the second guide section 52 with slight clearance left therebetween when the middle and outer cups 42 and 43 are in their closest positions. The bent portion 43*c* formed by bending the tip of the upper end portion 43*b* downward has a length that makes the bent portion 43*c* cover the bent portion 52*c* of the second guide section 52 from the side when the middle and outer cups 42 and 43 are in their closest positions.

The inner, middle, and outer cups 41, 42, and 43 are capable of moving up and down independently of each other. Specifically, the inner, middle, and outer cups 41, 42, and 43 are provided with respective lifting mechanisms (not shown in the drawings) that move corresponding ones of the inner, middle, and outer cups 41, 42, and 43 up and down separately. Various publicly known mechanisms such as a ball screw mechanism and an air cylinder are applicable as these lifting mechanisms.

The partition plate 15 divides the space inside the chamber 10 and surrounding the processing cup 40 into parts, one above the other. The partition plate 15 may be a single plate-like member surrounding the processing cup 40 or may be formed by joining multiple plate-like members together. The partition plate 15 may be given a through hole passing through the partition plate 15 in the thickness direction or a notch. In the first preferred embodiment, the partition plate 15 is given through holes for letting support shafts pass through that support the nozzle bases 33, 63, and 68 of the upper processing liquid nozzles 30, 60, and 65 respectively.

The outer circumferential edge of the partition plate 15 is coupled to the side wall 11 of the chamber 10. A peripheral portion of the partition plate 15 surrounding the processing cup 40 has a circular shape of a diameter larger than the outer diameter of the outer cup 43. This prevents the partition plate 15 from hindering up and down movement of the outer cup 43.

An exhaust duct 18 is provided to a part of the side wall 11 of the chamber 10 in a position near the floor wall 13. The exhaust duct 18 is communicatively connected to an exhaust mechanism not shown in the drawings. Clean air is supplied from the fan filter unit 14 to flow down inside the chamber 10, and part of the clean air after passing through space between the processing cup 40 and the partition plate 15 is drawn out of the substrate processing apparatus 100 through the exhaust duct 18.

The camera 70 is arranged inside the chamber 10 and above the partition plate 15. FIG. 4 shows the position of the camera 70 and that of the upper processing liquid nozzle 30 relative to each other. The camera 70 for example includes a CCD as one of solid-state imaging elements, an electronic shutter, and an optical system such as a lens. The upper processing liquid nozzle 30 is moved back and forth by the nozzle base 33 between a processing position (position with dotted line of FIG. 4) above a substrate W held on the spin chuck 20 and a standby position (position with solid line of FIG. 4) outside the processing cup 40. The processing position is a position where a processing liquid is discharged from the upper processing liquid nozzle 30 to the upper surface of a substrate W held on the spin chuck 20 to clean the substrate W. The standby position is a position where discharge of a processing liquid is stopped and the upper processing liquid nozzle 30 is placed in standby when cleaning is not to be performed. A standby pot for housing the discharge head 31 of the upper processing liquid nozzle 30 may be provided in the standby position.

The camera 70 is arranged in a position where an imaging field of view of the camera 70 includes at least the tip of the upper processing liquid nozzle 30 in the processing position, specifically the discharge head 31 and its vicinity. In the first preferred embodiment, the camera 70 is arranged in a position so as to take an image of the upper processing liquid nozzle 30 in the processing position from the front side and from above as shown in FIG. 4. This allows the camera 70 to take an image of an imaging region including the tip of the upper processing liquid nozzle 30 in the processing position. The imaging region of the camera 70 includes a surface of a substrate W held on the spin chuck 20 as a background of the upper processing liquid nozzle 30. Likewise, the camera 70 can take an image of an imaging region including the tip of the upper processing liquid nozzle 60 and an image of an imaging region including the tip of the upper processing liquid nozzle 65. If the camera 70 is arranged in the position shown in FIGS. 2 and 4, the upper processing liquid nozzles 30 and 60 are to move laterally within the imaging field of view of the camera 70. This allows the camera 70 to properly take an image of the motion of each of the upper processing liquid nozzles 30 and 60 in the processing position or in the vicinity thereof. Meanwhile, the upper processing liquid nozzle 65 is to move in a depth direction within the imaging field of view. This might hinder proper image taking of the upper processing liquid nozzle 65 in the processing position or in the vicinity thereof. In this case, a camera dedicated to the upper processing liquid nozzle 65 may be provided separately from the camera 70.

As shown in FIG. 3, an illumination part 71 is arranged inside the chamber 10 and above the partition plate 15. The chamber 10 is generally in a dark-room environment. Thus, for image taking by the camera 70, the illumination part 71 illuminates the upper processing liquid nozzles 30, 60, and 65 in their processing positions or in the vicinities thereof with light.

FIG. 5 is a block diagram showing the camera 70 and the controller 9. The structure of the controller 9 as hardware provided in the substrate processing apparatus 100 is the same as that of a general computer. Specifically, the controller 9 for example includes a CPU for various calculations, a ROM as a read-only memory storing a basic program, a RAM as a memory from and into which various information can be read and written freely, and a magnetic disk storing control software or data. Execution of a certain processing program by the CPU of the controller 9 makes the controller 9 control each operating mechanism of the substrate processing apparatus 100, thereby realizing processing in the substrate processing apparatus 100.

A determining part 91 and a setting part 93 of FIG. 5 are functional parts realized in the controller 9 by execution of the certain processing program by the CPU of the controller 9. As described in detail later, the determining part 91 processes an image taken by the camera 70 to make various determinations and the setting part 93 sets a parameter or a region to be used by the determining part 91 for making the determinations. A storage part 92 inside the controller 9 is formed of the aforementioned RAM or magnetic disk. The storage part 92 stores data or an input value about an image taken by the camera 70 or a parameter set by the setting part 93, for example.

The operation of the substrate processing apparatus 100 of the aforementioned structure is described next. According to a general procedure of processing a substrate W in the substrate processing apparatus 100, the main transport robot 103 transports an unprocessed substrate W received from the indexer 102 to each cleaning unit 1. After the substrate W is cleaned in this cleaning unit 1, the main transport robot 103 takes the processed substrate W out of this cleaning unit 1 and returns the processed substrate W to the indexer 102. A typical procedure of cleaning a substrate W in each cleaning unit 1 is briefly described as follows. A chemical liquid is supplied to a surface of a substrate W to perform certain process on the substrate W with the chemical liquid. Next, deionized water is supplied to rinse the substrate W with deionized water. Then, the substrate W is rotated at high speed to dry the substrate W by shaking-off.

For processing a substrate W in the cleaning unit 1, the substrate W is held on the spin chuck 20 and the processing cup 40 moves up and down. For processing a substrate W with a chemical liquid, only the outer cup 43 moves up to form an opening surrounding the substrate W held on the spin chuck 20 between the upper end portion 43*b* of the outer cup 43 and the second guide section 52 of the middle cup 42, for example. In this condition, the substrate W is rotated together with the spin chuck 20 and a chemical liquid is supplied from the upper and lower processing liquid nozzles 30 and 28 to the upper and lower surfaces of the substrate W. The supplied chemical liquid is caused to flow through the upper and lower surfaces of the substrate W by centrifugal force generated as a result of rotation of the substrate W and is then splashed laterally from a peripheral portion of the substrate W. In this way, process on the substrate W with the chemical liquid proceeds. The chemical liquid splashed from the peripheral portion of the rotating substrate W is received by the upper end portion 43*b* of the outer cup 43. Then, this chemical liquid flows down through the inner surface of the outer cup 43 to be collected in the outer recovery slot 51.

For rinsing with deionized water, all the inner, middle, and outer cups 41, 42, and 43 move up to make the first guide section 47 of the inner cup 41 surround a substrate W held on the spin chuck 20, for example. In this condition, the substrate W is rotated together with the spin chuck 20 and deionized water is supplied from the upper and lower processing liquid nozzles 30 and 28 to the upper and lower surfaces of the substrate W. The supplied deionized water is caused to flow through the upper and lower surfaces of the substrate W by centrifugal force generated as a result of rotation of the substrate W and is then splashed laterally from a peripheral portion of the substrate W. In this way, process on the substrate W with deionized water proceeds. The deionized water splashed from the peripheral portion of the rotating substrate W flows down through the inner wall of the first guide section 47 and is discharged through the disposal slot 49. If deionized water is to be collected along a path different from a path for a chemical liquid, the middle and outer cups 42 and 43 may be moved up to form an opening surrounding a substrate W held on the spin chuck 20 between the upper end portion 52*b* of the second guide section 52 of the middle cup 42 and the upper end portion 47*b* of the first guide section 47 of the inner cup 41.

For drying by shaking-off, all the inner, middle, and outer cups 41, 42, and 43 move down to place each of the upper end portion 47*b* of the first guide section 47 of the inner cup 41, the upper end portion 52*b* of the second guide section 52 of the middle cup 42, and the upper end portion 43*b* of the outer cup 43 in a position below a substrate W held on the spin chuck 20, for example. In this condition, the substrate W is rotated at high speed together with the spin chuck 20 to shake off water droplets from the substrate W, thereby drying the substrate W.

In the first preferred embodiment, when a processing liquid is discharged from the upper processing liquid nozzle 30 to the upper surface of a substrate W, the determining part 91 performs certain image processing on an image of the upper processing liquid nozzle 30 in the processing position taken by the camera 70 to determine the presence or absence of discharge of the processing liquid. A technique relating to this determination is described in detail below. The determination mentioned herein is about discharge of a processing liquid from the upper processing liquid nozzle 30. Meanwhile, this determination may be applied to discharge from the other upper processing liquid nozzles 60 and 65.

Figure 6:
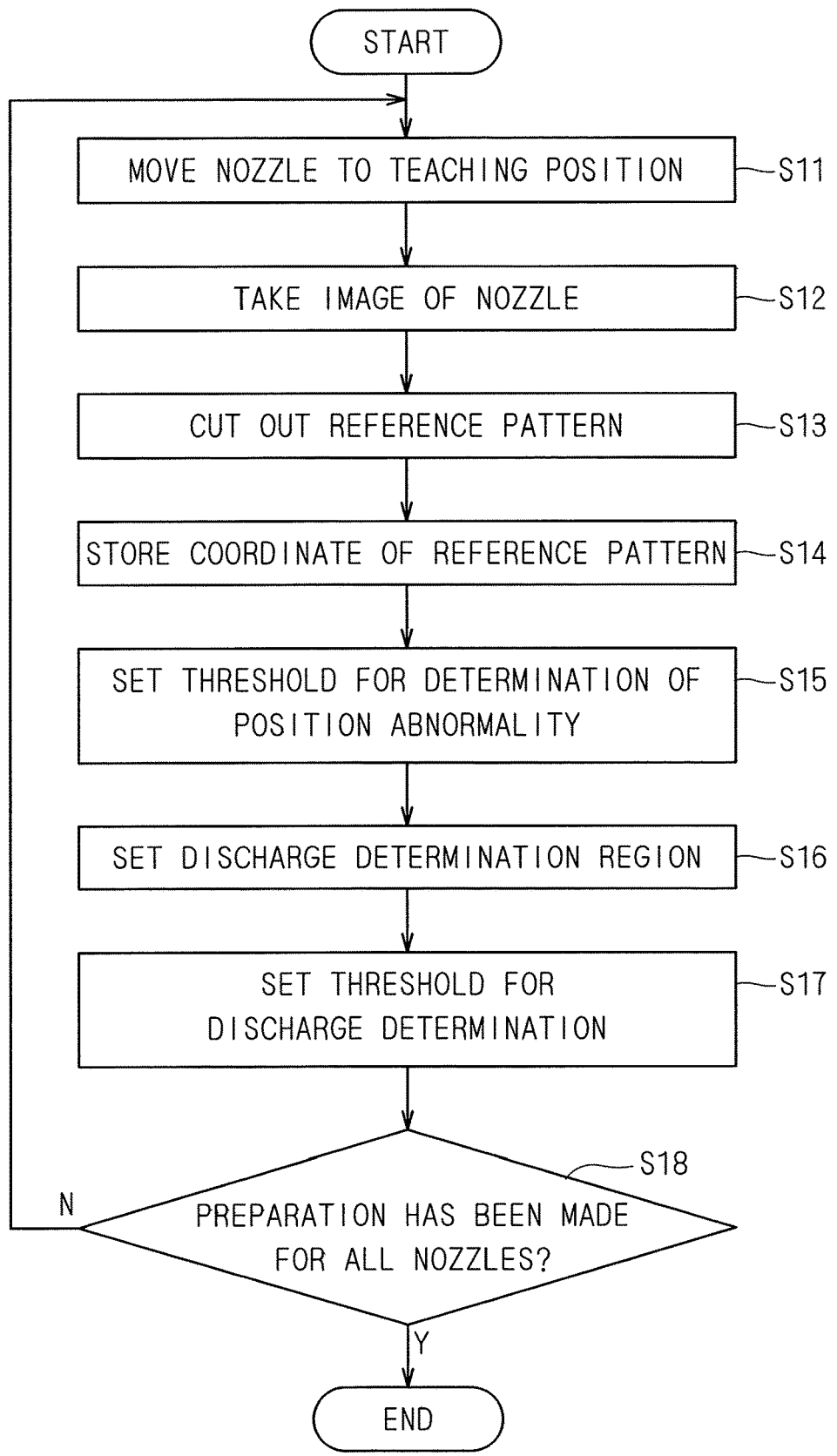
FIG. 6 is a flowchart showing a procedure of setting a parameter for determination.
Figure 7:
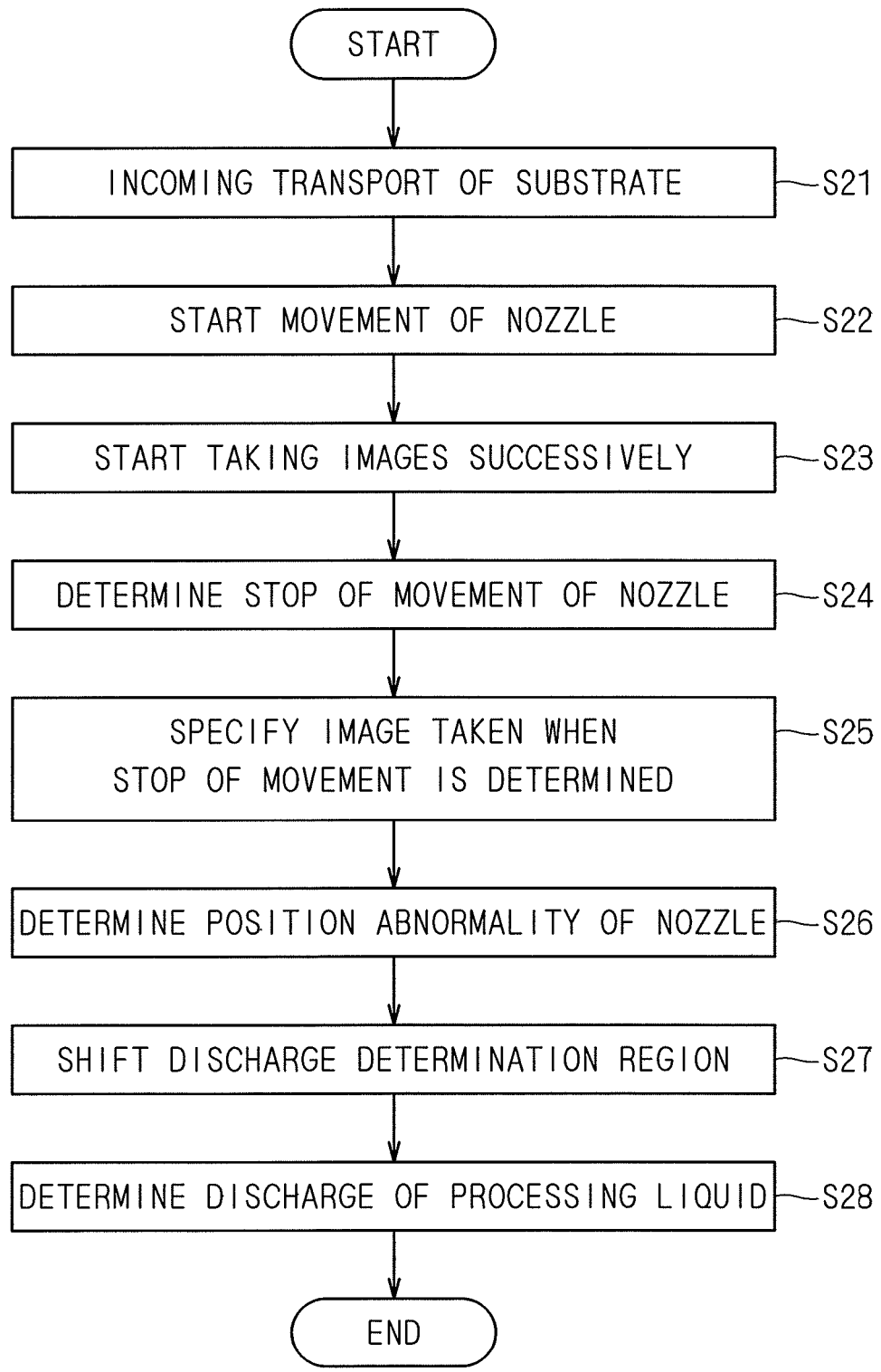
FIG. 7 is a flowchart showing a procedure of determination by a determining part.

FIGS. 6 and 7 are flowcharts each showing a procedure of determination by the determining part 91. FIG. 6 shows a procedure of advance preparation for determination. FIG. 7 shows a procedure of determination to be made when a target substrate W is transported into the cleaning unit 1. The advance preparation is made according to the procedure shown in FIG. 6 before a target substrate W is actually processed. This preparation may be made during maintenance of the substrate processing apparatus 100, for example.

For teaching of the upper processing liquid nozzle 30 during maintenance, for example, the upper processing liquid nozzle 30 is first moved to a teaching position (step S11). The teaching mentioned herein is to teach the upper processing liquid nozzle 30 to operate properly. This teaching corrects a position where the upper processing liquid nozzle 30 stops to a proper position (teaching position). Thus, by moving the upper processing liquid nozzle 30 to the teaching position during the teaching, the upper processing liquid nozzle 30 is placed in the proper processing position correctly. The proper processing position is a position that achieves requested substrate processing if a processing liquid is discharged from the upper processing liquid nozzle 30 in this processing position.

When the upper processing liquid nozzle 30 has moved to the proper processing position, the camera 70 takes an image of an imaging region including the tip of the upper processing liquid nozzle 30 (step S12). FIG. 8 shows an example of an image of the imaging region including the tip of the upper processing liquid nozzle 30 in the processing position taken by the camera 70. An imaging region PA includes the tip of the upper processing liquid nozzle 30 in the processing position above a substrate W held on the spin chuck 20. A substrate W is not always held on the spin chuck 20 during the maintenance. Thus, the imaging region PA is not always required to include a substrate W.

Next, a reference pattern is cut out from the image taken in step S12 (step S13). When the image is taken in step S12, the upper processing liquid nozzle 30 is placed in the proper processing position correctly as a result of the teaching. Thus, the image taken by the camera 70 in step S12 can be a nozzle position standard image (second standard image) showing the proper processing position of the upper processing liquid nozzle 30. In step S13, a partial image region including the tip portion of the upper processing liquid nozzle 30 is cut out as a reference pattern RP from the nozzle position standard image as shown in FIG. 8. As an example, an operator may cut out this reference pattern RP by manually designating a region to become the reference pattern RP while seeing the image taken in step S12 during the teaching. The cut out reference pattern RP is stored together with its coordinates in the image into the storage part 92 of the controller 9 (step S14).

Next, the operator sets a threshold for determination of position abnormality (step S15). The threshold set in this step is used to determine position abnormality of the upper processing liquid nozzle 30 (step S26 of FIG. 7) described later. This threshold is for displacement between a nozzle position in the reference pattern RP in the nozzle position standard image taken in step S12 and a nozzle position in an image specified in step S25. By setting this threshold smaller, the position of the upper processing liquid nozzle 30 is determined to be abnormal more easily even if displacement between the nozzle positions in these images is small. Specifically, a criterion for the determination becomes stricter. The threshold set in step S15 is stored into the storage part 92.

Next, a discharge determination region is set in the image taken in step S12 (step S16). As illustrated in FIG. 8, the image of the imaging region PA taken by the camera 70 includes not only the tip and its vicinity of the upper processing liquid nozzle 30 but also a substrate W held on the spin chuck 20 or a member inside the cleaning unit 1, for example. It is preferable that such a background have lowest possible influence on determination of discharge of a processing liquid from the upper processing liquid nozzle 30. In particular, influence of an image of a processing liquid reflected at a surface of a substrate W should be eliminated. In response, in step S16, a discharge determination region SP is set in the image of the imaging region PA taken by the camera 70. The discharge determination region SP includes a part of a region from the tip of the upper processing liquid nozzle 30 to a substrate W held on the spin chuck 20. The operator can also set this discharge determination region SP by designating the region manually while seeing the image taken in step S12. The set discharge determination region SP is stored into the storage part 92 of the controller 9. Unlike the aforementioned reference pattern RP, the discharge determination region SP set in this step is not an image itself but it is a region in the image of the imaging region PA taken by the camera 70. The discharge determination region SP is represented as coordinate data indicating the rectangular shape of the discharge determination region SP of FIG. 8, for example.

After setting the discharge determination region SP, the operator sets a threshold for discharge determination (step S17). The threshold set in this step is used to determine discharge of a processing liquid (step S28 of FIG. 7) described later. This threshold is for a difference between an image taken by the camera 70 before discharge of a processing liquid and an image taken by the camera 70 after the discharge. By setting this threshold smaller, the presence of discharge of a processing liquid from the upper processing liquid nozzle 30 is determined more easily even if the difference is small. The threshold set in step S17 is stored into the storage part 92.

The advance preparation for the upper processing liquid nozzle 30 is made in the aforementioned way. Advance preparation same as that shown in steps S11 to S17 is made for the other upper processing liquid nozzles 60 and 65 (step S18). This advance preparation is only required to be made in advance during teaching. Once the advance preparation is made, it is not required to be made repeatedly in the absence of change in a teaching position. The aforementioned advance preparation is not required for the lower processing liquid nozzle 28 in a fixed position.

The following describes a procedure of processing a target substrate W by referring to FIG. 7 that is to be taken after the advance preparation of FIG. 6 is made. First, the target substrate W is transported into the cleaning unit 1 by the main transport robot 103 (step S21). The transported substrate W is held in a horizontal posture on the spin chuck

20. At the same time, the processing cup 40 moves up and down to reach a given height.

After the new target substrate W is held on the spin chuck 20, the upper processing liquid nozzle 30 starts moving from the standby position toward the processing position (step S22). The upper processing liquid nozzle 30 moves in response to control on the nozzle base 33 by the controller 9 according to a predetermined recipe (describing a procedure and a condition for processing a substrate W). If the recipe describes discharge of a processing liquid from the upper processing liquid nozzle 30 to last a given period of time or more (such as five seconds or more), the controller 9 instructs the determining part 91 to make discharge determination to coincide with timing of start of the movement of the upper processing liquid nozzle 30. The timing for the controller 9 to instruct discharge determination is not required to be strictly the same as the timing of start of the movement of the upper processing liquid nozzle 30. Meanwhile, it is preferable that the controller 9 instruct discharge determination in good time so as to allow the determining part 91 to execute step S23 and its subsequent steps before the upper processing liquid nozzle 30 stops moving.

The determining part 91 having been instructed to make discharge determination makes the camera 70 start taking images successively (step S23). The camera 70 takes images of the imaging region PA successively at regular intervals. As an example, the camera 70 takes images successively at intervals of 33 milliseconds (30 frames per second). Specifically, the camera 70 starts taking moving images from a point in time when the new target substrate W is held on the spin chuck 20 and the upper processing liquid nozzle 30 starts moving from the standby position toward the processing position. A point in time when the camera 70 starts taking images successively corresponds to a point in time when the upper processing liquid nozzle 30 starts moving from the standby position. Thus, the upper processing liquid nozzle 30 has not reached the imaging region PA in this point in time.

After the camera 70 starts taking images successively, the determining part 91 determines whether the upper processing liquid nozzle 30 has stopped moving (step S24). The movement itself of the upper processing liquid nozzle 30 proceeds in response to control on the nozzle base 33 by the controller 9 according to the aforementioned recipe. Stop of the movement is also controlled by the controller 9. The determining part 91 determines based on multiple images taken successively by the camera 70 whether the upper processing liquid nozzle 30 has stopped moving independently of the control by the controller 9. More specifically, the determining part 91 calculates every difference between successive images of the imaging region PA taken successively by the camera 70. Based on whether this difference is a fixed value or less, the determining part 91 determines whether the upper processing liquid nozzle 30 has stopped moving. Calculating a difference between successive images means obtaining the sum of the absolute values of differences between the tone values of all pixels in one image out of multiple images taken successively and those of all pixels in a next image out of these multiple images.

Figure 9:
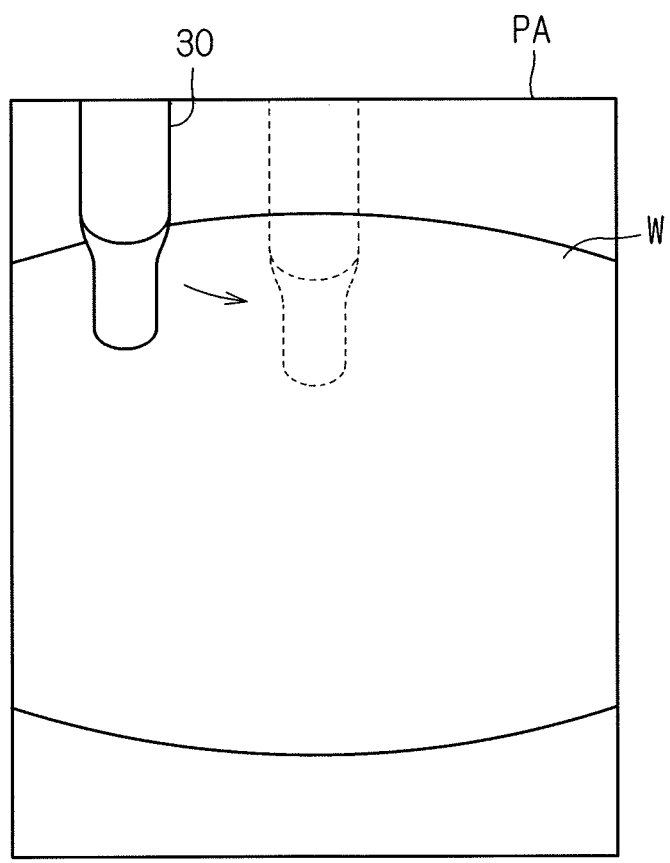
FIG. 9 shows movement of the upper processing liquid nozzle in the imaging region.

FIG. 9 shows movement of the upper processing liquid nozzle 30 in the imaging region PA. If the camera 70 takes images of the imaging region PA successively while the upper processing liquid nozzle 30 moves in the imaging region PA, the position of the upper processing liquid nozzle 30 differs between one image and a next image. A residual image of the upper processing liquid nozzle 30 appears depending on a difference between these images. In contrast, if the camera 70 takes images of the imaging region PA successively after the upper processing liquid nozzle 30 stops moving at the processing position (dotted line position of FIG. 9) in the imaging region PA, the position of the upper processing liquid nozzle 30 in one image and that in a next image are the same. A residual image of the upper processing liquid nozzle 30 disappears depending on a difference between these images. Thus, if the sum of differences between the tone values of all pixels in an image (in one image) of the imaging region PA and those of pixels in a successive image (in a next image) of the imaging region PA taken successively by the camera 70 is the fixed value or less, the determining part 91 determines that the upper processing liquid nozzle 30 has stopped moving. To prevent erroneous determination due to noise or the like, the determining part 91 may calculate every difference between one image and a next image out of five successive images (in this case, four differences are calculated) and then determine that the upper processing liquid nozzle 30 has stopped moving if all these differences are the fixed value or less.

Next, the determining part 91 specifies an image as a discharge standard image (first standard image) (step S25). The image specified in this step is one of those taken successively by the camera 70 and obtained when the determining part 91 determines that the upper processing liquid nozzle 30 has stopped moving in step S24. The specified discharge standard image is stored into the storage part 92 of the controller 9. This discharge standard image is an image of the imaging region PA taken when the upper processing liquid nozzle 30 reaches the processing position and stops. Discharge of a processing liquid from the upper processing liquid nozzle 30 has not started when the upper processing liquid nozzle 30 reaches the processing position and stops. This means that the discharge standard image is an image of the imaging region PA taken by the camera 70 before a processing liquid is discharged from the upper processing liquid nozzle 30 having moved to the processing position.

Steps 21 to S25 are performed each time a new target substrate W is transported into the cleaning unit 1. Specifically, in the first preferred embodiment, the discharge standard image is obtained each time a new target substrate W transported into the cleaning unit 1 is held on the spin chuck 20 and the upper processing liquid nozzle 30 moves to the processing position.

Next, the determining part 91 compares the nozzle position standard image and the discharge standard image to determine whether there is position abnormality of the upper processing liquid nozzle 30 in the processing position (step S26). The nozzle position standard image is an image of the imaging region PA taken by the camera 70 when the upper processing liquid nozzle 30 is placed in the processing position correctly during the teaching. The discharge standard image is an image of the imaging region PA taken by the camera 70 when the target substrate W is held on the spin chuck 20 and the upper processing liquid nozzle 30 reaches the processing position and stops. Thus, comparing the nozzle position standard image and the discharge standard image makes it possible to determine whether a position above the target substrate W where the upper processing liquid nozzle 30 has moved and stopped is a proper processing position.

More specifically, the determining part 91 compares the reference pattern RP cut out from the nozzle position standard image in step S13 and an image of a partial region in the discharge standard image corresponding to the reference pattern RP to calculate a difference between the respective coordinates of the upper processing liquid nozzle 30 in these images (displacement). These images can be compared by a publicly-known pattern matching technique. If the displacement of the upper processing liquid nozzle 30 calculated by the pattern matching is the threshold or more set in step S15, the determining part 91 determines that the position of the upper processing liquid nozzle 30 is abnormal. If the position of the upper processing liquid nozzle 30 is determined to be abnormal, the controller 9 performs certain process responsive to the abnormality (as an example, the controller 9 issues an alarm or suspends the processing). If the calculated displacement of the upper processing liquid nozzle 30 is smaller than the threshold set in step S15, the determining part 91 determines that there is no abnormality in the position of the upper processing liquid nozzle 30.

After the upper processing liquid nozzle 30 reaches the processing position and stops, the substrate W is rotated under control by the controller 9 and discharge of a processing liquid from the upper processing liquid nozzle 30 is started. Then, the determining part 91 determines discharge of the processing liquid from the upper processing liquid nozzle 30 based on images taken successively by the camera 70.

The determining part 91 shifts the discharge determination region SP for determination of discharge of the processing liquid (step S27). The discharge determination region SP is set in the nozzle position standard image in step S16 as a part of a region from the tip of the upper processing liquid nozzle 30 to a substrate W. In step S26 described above, displacement between the upper processing liquid nozzle 30 in the nozzle position standard image and that in the discharge standard image is calculated. Based on a result of the calculation, the determining part 91 shifts the discharge determination region SP in step S27. Specifically, the determining part 91 moves the discharge determination region SP by an amount corresponding to the displacement calculated in step S26.

The camera 70 continues taking images of the imaging region PA successively after the upper processing liquid nozzle 30 is determined to have stopped moving in step S24. Specifically, after starting taking images of the imaging regions PA successively (step S23) simultaneously with start of movement of the upper processing liquid nozzle 30, the camera 70 continues taking images successively at regular intervals.

The determining part 91 compares the discharge standard image of the imaging region PA taken by the camera 70 before discharge of the processing liquid from the upper processing liquid nozzle 30 having moved to the processing position is started and a monitor target image of the imaging region PA taken by the camera 70 thereafter to determine discharge of the processing liquid from the upper processing liquid nozzle 30 (step S28). More specifically, the determining part 91 sequentially compares multiple monitor target images taken successively by the camera 70 after stop of movement of the upper processing liquid nozzle 30 is determined to the discharge standard image to determine discharge of the processing liquid from the upper processing liquid nozzle 30.

The monitor target image is an image of the imaging region PA taken by the camera 70 after the upper processing liquid nozzle 30 is determined to have stopped moving (specifically, after the discharge standard image is specified). The camera 70 continues taking images of the imaging region PA successively after the upper processing liquid nozzle 30 is determined to have stopped moving. Thus, multiple monitor target images are obtained at regular intervals. Discharge of the processing liquid is started after elapse of a given period of time from when the upper processing liquid nozzle 30 stops moving at the processing position. Thus, discharge of the processing liquid is to be reflected in any of these monitor target images taken in any point in time. The determining part 91 determines discharge of the processing liquid from the upper processing liquid nozzle 30 by sequentially comparing these monitor target images to the discharge standard image.

Figure 10A:
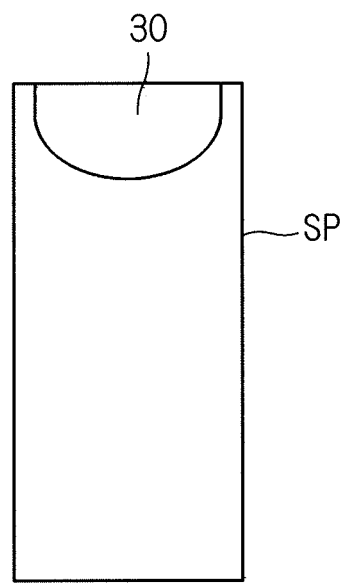
FIG. 10A shows a discharge standard image.
Figure 10B:
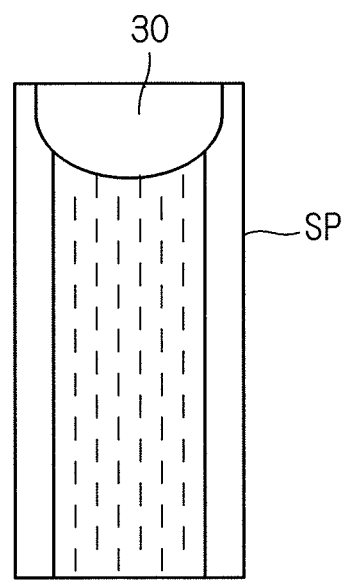
FIG. 10B shows a monitor target image.
Figure 12:
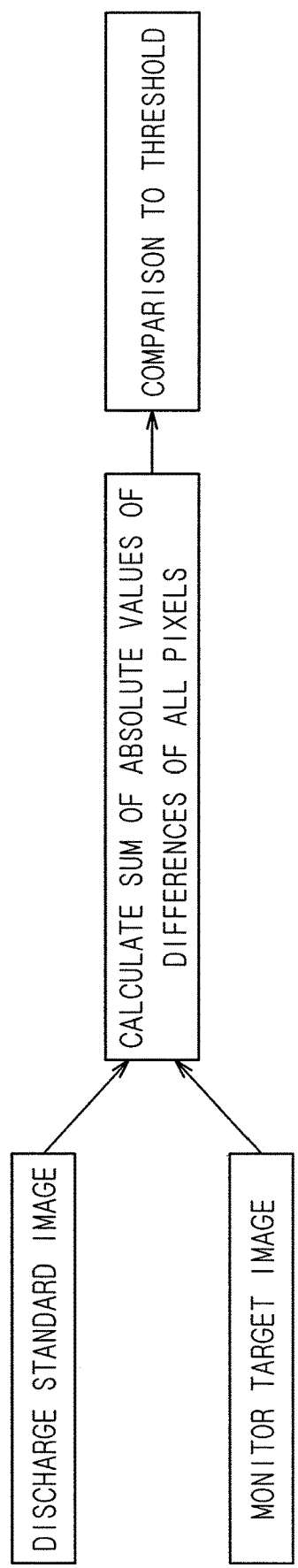
FIG. 12 schematically shows an example of an algorithm for determination of discharge of a processing liquid.

FIGS. 10A and 10B show the discharge standard image and the monitor target image respectively. FIG. 10A shows the discharge determination region SP in the discharge standard image. FIG. 10B shows the discharge determination region SP in the monitor target image taken after discharge of the processing liquid is started. FIG. 12 schematically shows an example of an algorithm for determination of discharge of the processing liquid. The determining part 91 calculates the sum of the absolute values of differences between the tone values of all pixels in the discharge determination region SP in one of the multiple monitor target images and those of corresponding pixels in the discharge determination region SP in the discharge standard image. Specifically, the determining part 91 calculates the sum of the absolute values of differences between the tone values of all pixels forming FIG. 10A and those of corresponding pixels forming FIG. 10B. The respective discharge determination regions SP in the discharge standard image and the monitor target image both result from the shift in step S27. Thus, even if the upper processing liquid nozzle 30 stopping at the processing position is displaced from the teaching position to an extent by which the position of the upper processing liquid nozzle 30 is not determined to be abnormal, the discharge determination region SP is set correctly as a part of a region from the tip of the upper processing liquid nozzle 30 to the substrate W.

Next, the determining part 91 compares the sum of the differences calculated in the aforementioned way and the threshold set in step S17. If the sum of the differences is the threshold or more set in advance in step S17, the determining part 91 determines that the processing liquid is discharged from the upper processing liquid nozzle 30. If the sum of the differences is smaller than this threshold, the determining part 91 determines that the processing liquid is not discharged from the upper processing liquid nozzle 30. The determining part 91 makes such comparison sequentially about multiple monitor target images of the imaging region PA taken by the camera 70 after the upper processing liquid nozzle 30 is determined to have stopped moving.

Figure 11:
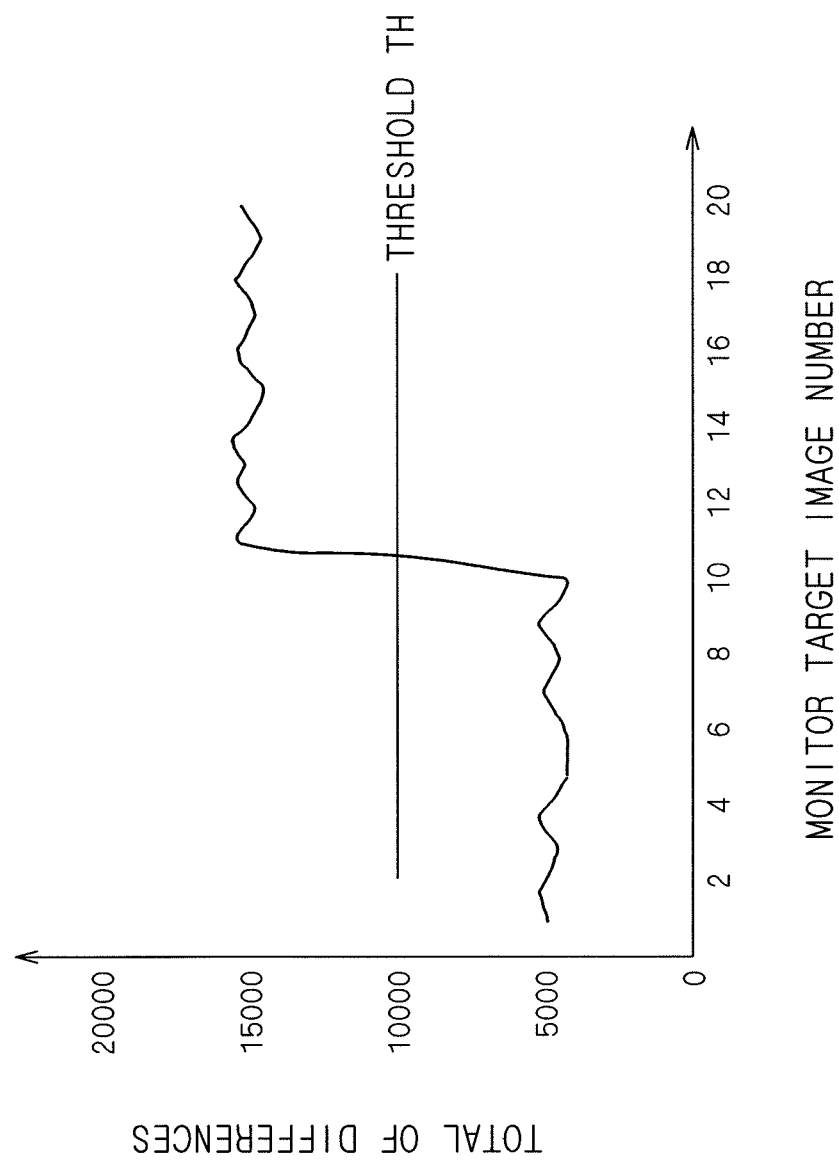
FIG. 11 shows comparison between the sum of differences and a threshold.

FIG. 11 shows comparison between the sum of differences and the threshold. The vertical axis of FIG. 11 shows the sum of the absolute values of differences in a pixel tone value. The horizontal axis of FIG. 11 shows respective numbers arranged in order regarding multiple monitor target images taken after the upper processing liquid nozzle 30 is determined to have stopped moving. Monitor target images (monitor target images of FIG. 11 including a tenth image as a last image) taken before the processing liquid is discharged from the upper processing liquid nozzle 30 are substantially the same as the discharge standard image shown in FIG. 10A. Thus, the sum of the absolute values of differences between the tone value of all pixels in the discharge determination region SP in such a monitor target image and those of corresponding pixels in the discharge determination region SP in the discharge standard image is relatively small. This sum is smaller than a threshold TH set in advance in step S17.

In contrast, as shown in FIG. 10B, monitor target images (monitor target images of FIG. 11 including an eleventh image and its subsequent images) taken after the processing liquid is discharged from the upper processing liquid nozzle 30 each include an image of the processing liquid being discharged. Thus, the sum of the absolute values of differences between the tone value of all pixels in the discharge determination region SP in such a monitor target image and those of corresponding pixels in the discharge determination region SP in the discharge standard image is relatively large. This sum is larger than the threshold TH set in advance in step S17.

If a condition where the processing liquid is determined to be discharged from the upper processing liquid nozzle 30 lasts for two seconds or more, specifically if the processing liquid is determined to be discharged based on 60 or more monitor target images taken at intervals of 33 milliseconds, the determining part 91 determines that the processing liquid is discharged stably and reliably from the upper processing liquid nozzle 30. In contrast, if the sum of differences in a pixel tone value does not reach the threshold or does not become a value larger than the threshold after elapse of a given period of time (five seconds, for example) from when the upper processing liquid nozzle 30 is determined to have stopped moving, the determining part 91 determines that the processing liquid is not discharged from the upper processing liquid nozzle 30 and determines that there is abnormality in the discharge of the processing liquid. A result of the determination by the determining part 91 about discharge of the processing liquid may be shown for example on a display provided to the controller 9. If discharge of the processing liquid from the upper processing liquid nozzle 30 is determined to be abnormal, the controller 9 may perform certain process responsive to the abnormality by suspending the processing, for example.

The aforementioned determination is about the upper processing liquid nozzle 30. If the different upper processing liquid nozzle 60 or 65 is to be used, a procedure same as that of FIG. 7 may be taken to make determination about the upper processing liquid nozzle 60 or 65.

In the first preferred embodiment, comparison is made between the discharge standard image of the imaging region PA taken by the camera 70 before a processing liquid is discharged from the upper processing liquid nozzle 30 having moved to the processing position and the monitor target image of the imaging region PA taken by the camera 70 thereafter to determine discharge of the processing liquid from the upper processing liquid nozzle 30. The discharge standard image is obtained each time a new target substrate W transported into the cleaning unit 1 is held on the spin chuck 20 and the upper processing liquid nozzle 30 moves to the processing position.

An image of the imaging region PA taken by the camera 70 includes not only the tip and its vicinity of the upper processing liquid nozzle 30 but also a substrate W held on the spin chuck 20 or a member inside the cleaning unit 1, for example. To eliminate the influence of such a background, particularly the influence of an image of a processing liquid reflected at a surface of a substrate W as thoroughly as possible, the discharge determination region SP is set in advance and a difference in the discharge determination region SP between the discharge standard image and the monitor target image is compared to the threshold.

Meanwhile, as shown in FIG. 8, an image of a surface of a substrate W held on the spin chuck 20 still remains even in the discharge determination region SP. As described above, various films including a resist film and an insulating film are deposited on the surface of the substrate W to form a pattern. As a result, a surface reflectance differs largely depending on the type of the substrate W.

In the first preferred embodiment, the discharge standard image is obtained each time a new target substrate W is held on the spin chuck 20 and the upper processing liquid nozzle 30 moves to the processing position. Thus, the discharge standard image and the monitor target image are to include the same image of a surface of a substrate W as a background. This eliminates the influence of this background on a difference between the discharge standard image and the monitor target image independently of the level of the surface reflectance of the substrate W. As a result, discharge of a processing liquid from the upper processing liquid nozzle 30 can be determined reliably independently of the type of a target substrate W.

The upper processing liquid nozzle 30 is determined to have stopped moving if a difference between successive images of the imaging region PA taken successively by the camera 70 is the fixed value or less. This means stop of the movement of the upper processing liquid nozzle 30 is determined automatically. Thus, after the upper processing liquid nozzle 30 stops moving at the processing position, discharge of a processing liquid from the upper processing liquid nozzle 30 can be determined based on an image taken by the camera 70 without the need for transmitting a dedicated trigger signal. This can simplify a hardware structure relating to determination of discharge of a processing liquid.

In addition to determining discharge of a processing liquid, the determining part 91 determines position abnormality of the upper processing liquid nozzle 30 having moved to the processing position. Due to an adjustment error caused during maintenance or temporal change, a processing liquid may be discharged from the upper processing liquid nozzle 30 having moved to a position displaced from the teaching position. This makes it impossible to achieve an originally expected result to cause a processing failure. In the first preferred embodiment, determining position abnormality of the upper processing liquid nozzle 30 makes it possible to prevent a processing failure to be caused by displacement of the upper processing liquid nozzle 30.

<Second Preferred Embodiment>

A second preferred embodiment of the present invention is described next. The structure of a substrate processing apparatus 100 of the second preferred embodiment is completely the same as that of the first preferred embodiment. A general procedure of processing a substrate W in the second preferred embodiment is also the same as the procedure in the first preferred embodiment. The second preferred embodiment differs from the first preferred embodiment in the technique of setting a parameter for determination. In the first preferred embodiment, an operator sets a parameter for determination manually. In the second preferred embodiment, the setting part 93 sets a parameter for determination automatically.

In the second preferred embodiment, when a processing liquid is discharged from the upper processing liquid nozzle 30 to the upper surface of a substrate W, the determining part 91 also performs certain image processing on an image of the upper processing liquid nozzle 30 in the processing position taken by the camera 70 to determine the presence or absence of displacement of the upper processing liquid nozzle 30 and discharge of the processing liquid. This technique is described in detail below. The determination mentioned herein is about the upper processing liquid nozzle 30. Meanwhile, the same determination may be applied to the other upper processing liquid nozzles 60 and 65.

Figure 14:
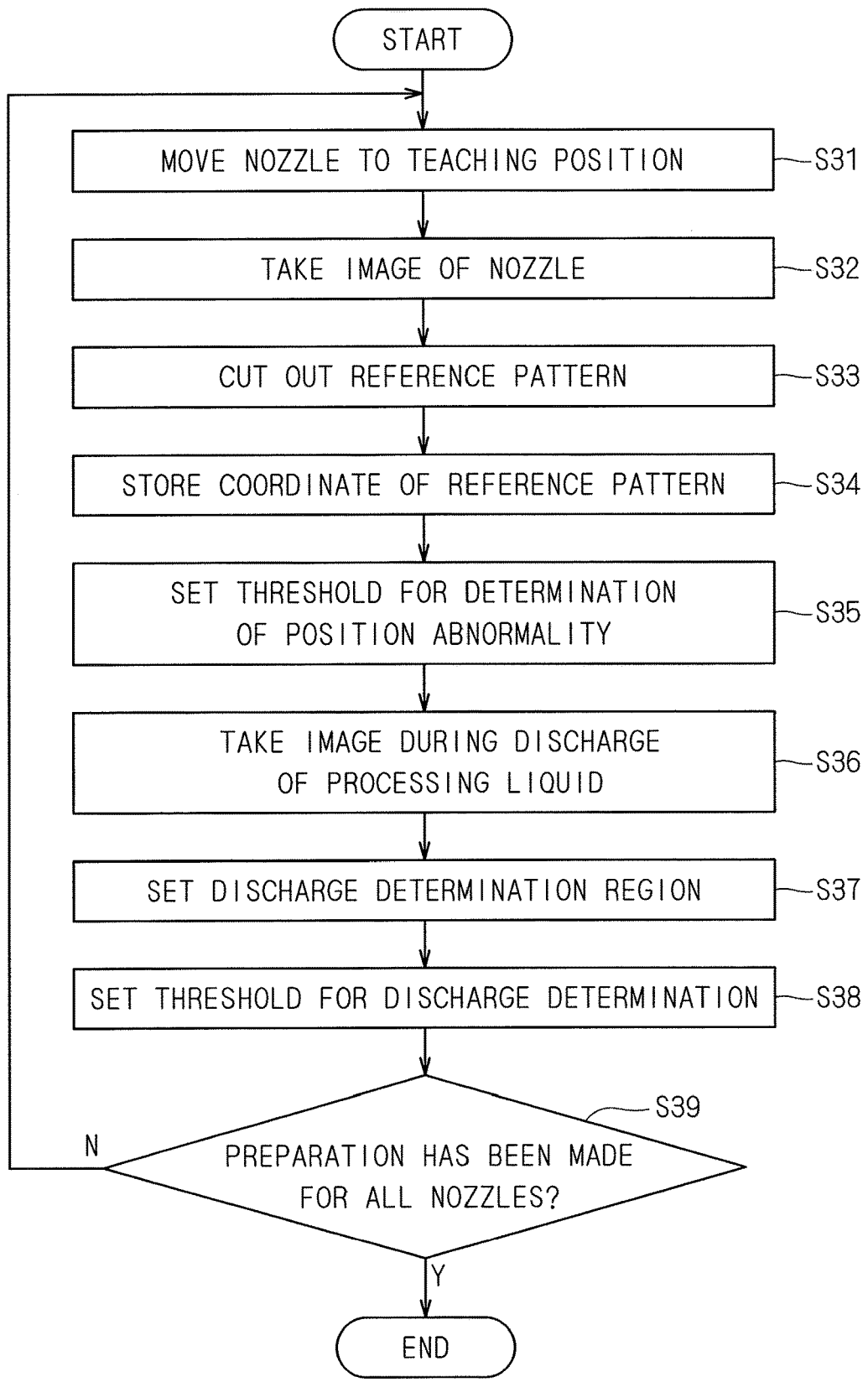
FIG. 14 is a flowchart showing a procedure of setting a parameter for determination in a second preferred embodiment.

FIG. 14 is a flowchart showing a procedure of setting a parameter for determination in the second preferred embodiment. The determining part 91 makes determination according to a procedure same as that shown in the flowchart of FIG. 7. The parameter for determination is set according to the procedure shown in FIG. 14 before a target substrate W is actually processed. The parameter for determination may be set during maintenance of the substrate processing apparatus 100, for example.

Like in the first preferred embodiment, for teaching of the upper processing liquid nozzle 30 during maintenance, for example, the upper processing liquid nozzle 30 is first moved to a teaching position (step S31). The teaching mentioned herein is to teach the upper processing liquid nozzle 30 to operate properly. This teaching corrects a position where the upper processing liquid nozzle 30 stops to a proper position (teaching position). Thus, by moving the upper processing liquid nozzle 30 to the teaching position during the teaching, the upper processing liquid nozzle 30 is placed in the proper processing position correctly. The proper processing position is a position that achieves requested substrate processing if a processing liquid is discharged from the upper processing liquid nozzle 30 in this processing position.

When the upper processing liquid nozzle 30 has moved to the proper processing position, the camera 70 takes an image of an imaging region including the tip of the upper processing liquid nozzle 30 (step S32). FIG. 8 shows an example of an image of the imaging region including the tip of the upper processing liquid nozzle 30 in the processing position taken by the camera 70. An imaging region PA includes the tip of the upper processing liquid nozzle 30 in the processing position above a substrate W held on the spin chuck 20. A substrate W is not always held on the spin chuck 20 during maintenance. Thus, the imaging region PA is not always required to include a substrate W.

Next, the setting part 93 cuts out a reference pattern from the image taken in step S32 (step S33). When the image is taken in step S32, the upper processing liquid nozzle 30 is placed in the proper processing position correctly as a result of the teaching. Thus, the image taken by the camera 70 in step S32 can be a nozzle position standard image showing the proper processing position of the upper processing liquid nozzle 30. In step S33, the setting part 93 automatically sets a partial image region including the tip portion of the upper processing liquid nozzle 30 as a reference pattern RP in this nozzle position standard image as shown in FIG. 8. Setting of the reference pattern RP by the setting part 93 is described continuously below.

Figure 15A:
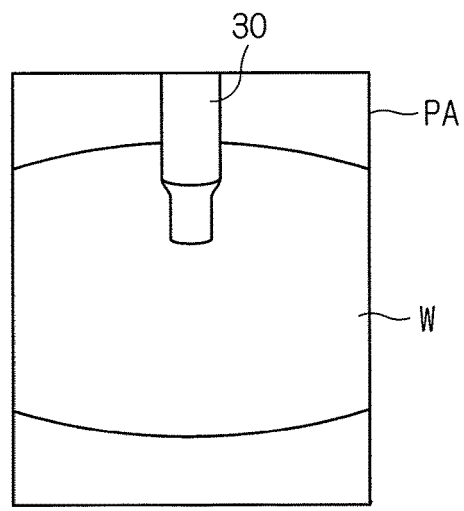
FIGS. 15A, 15B, and 15C show image processing performed to specify the coordinate of the upper processing liquid nozzle.
Figure 15B:
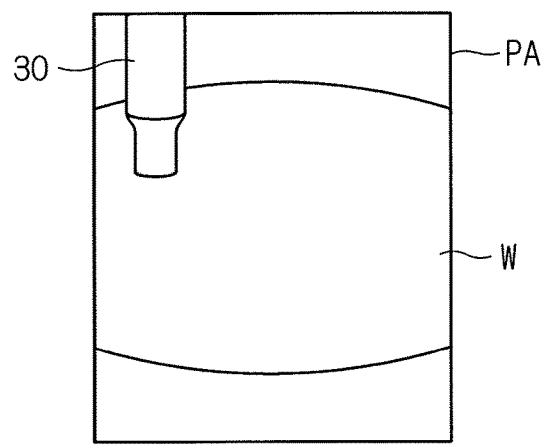
Figure 15C:
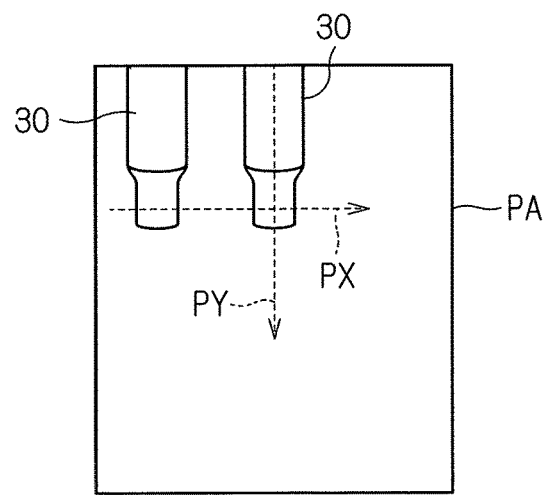

The setting part 93 specifies the coordinate of the upper processing liquid nozzle 30 in the nozzle position standard image of the imaging region PA taken by the camera 70 when the upper processing liquid nozzle 30 is in the processing position correctly. FIGS. 15A, 15B, and 15C show image processing performed to specify the coordinate of the upper processing liquid nozzle 30. FIG. 15A shows an image of the imaging region PA taken by the camera 70 when the upper processing liquid nozzle 30 is in the processing position correctly, specifically the same nozzle position standard image as that shown in FIG. 8.

After obtaining the nozzle position standard image, the upper processing liquid nozzle 30 moves a given amount in a given distance under control by the controller 9. The upper processing liquid nozzle 30 can move either in a clockwise direction or an anticlockwise direction of FIG. 4. Specifically, the upper processing liquid nozzle 30 can move either to the right or to the left in the imaging region PA. The upper processing liquid nozzle 30 can move an amount that is not specifically limited but it is only required to be larger than the diameter of the upper processing liquid nozzle 30.

When the upper processing liquid nozzle 30 in the processing position correctly moves the given amount in the given distance and then stops, the camera 70 takes an image of the imaging region PA to obtain a reference image. FIG. 15B shows an example of such a reference image. The nozzle position standard image of FIG. 15A and the reference image of FIG. 15B differ only in the position of the upper processing liquid nozzle 30.

Next, the setting part 93 calculates the absolute value of a difference between the nozzle position standard image of FIG. 15A and the reference image of FIG. 15B to obtain a difference image. More specifically, the setting part 93 calculates the absolute values of differences between the tone values of all pixels in the nozzle position standard image and those of corresponding pixels in the reference image to obtain the difference image. FIG. 15C shows an example of such a difference image.

The imaging region PA in the nozzle position standard image and that in the reference image taken by the camera 70 are completely the same. Except for the position of the upper processing liquid nozzle 30, the backgrounds of these images are the same (such as a surface of a substrate W or a structure inside the cleaning unit 1). Thus, in the difference image showing the difference between the nozzle position standard image and the reference image, a background such as a surface of a substrate W disappears completely and only the image of the upper processing liquid nozzle 30 in the nozzle position standard image and that of the upper processing liquid nozzle 30 in the reference image are extracted as shown in FIG. 15C. The difference image results from the absolute value of the difference between the nozzle position standard image and the reference image, so that the two upper processing liquid nozzles 30 in these images remain in the difference image. In the example of FIG. 15C, one of the images of the two upper processing liquid nozzles 30 on the right side is an image of the upper processing liquid nozzle 30 placed in the proper processing position correctly.

Figure 16:
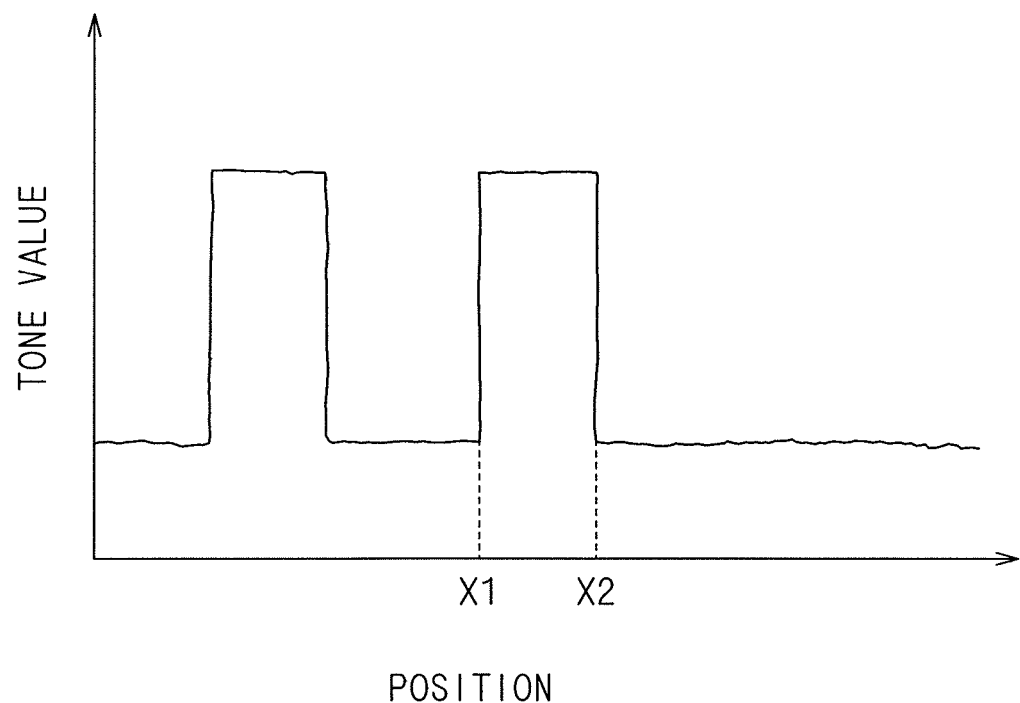
FIG. 16 shows an example of a tone value profile used to specify the coordinates of opposite ends of the upper processing liquid nozzle in a width direction.

Next, a tone value profile is obtained along a line PX passing through the respective tip portions (respective discharge heads 31) of the two upper processing liquid nozzles 30 in the direction of an X axis in the difference image. FIG. 16 shows the tone value profile taken along the line PX in the difference image. In FIG. 16, two parts of relatively high tone values correspond to the two upper processing liquid nozzles 30 in the difference image. The setting part 93 specifies a coordinate x1 and a coordinate x2 at opposite ends of one of these two parts on the right side, specifically opposite ends of the part corresponding to the upper processing liquid nozzle 30 placed in the proper processing position correctly. The coordinates x1 and x2 are those of the opposite ends of the upper processing liquid nozzle 30 in the width direction placed in the processing position correctly in the difference image. The coordinates of the upper processing liquid nozzle 30 on the right side in the difference image and those of the upper processing liquid nozzle 30 in the nozzle position standard image are the same. Thus, the coordinates x1 and x2 are also the coordinates of the opposite ends of the upper processing liquid nozzle 30 in the width direction in the nozzle position standard image. Which one of the two parts of the relatively high tone values in the tone value profile is the upper processing liquid nozzle 30 placed in the processing position correctly can easily be determined based on a direction where the upper processing liquid nozzle 30 has moved when the reference image is obtained.

Figure 17:
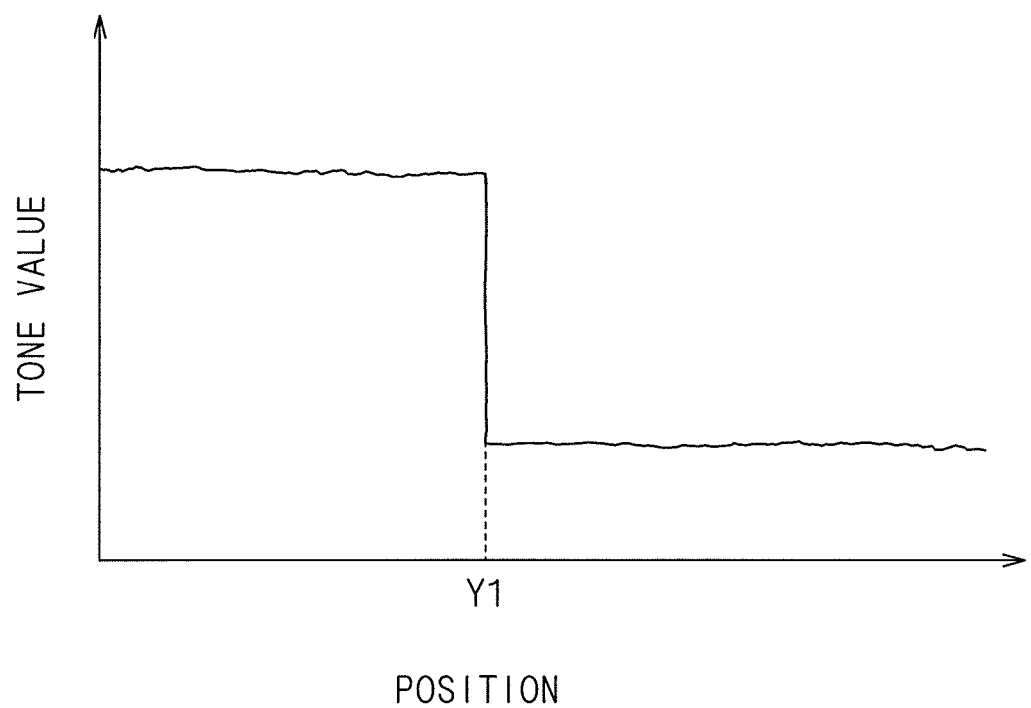
FIG. 17 shows an example of a tone value profile used to specify the coordinate of the tip of the upper processing liquid nozzle.

Next, the setting part 93 obtains a tone value profile along a line PY extending between the coordinates x1 and x2 in the direction of a Y axis in the difference image. FIG. 17 shows the tone value profile taken along the line PY in the difference image. The line PY extending between the coordinates x1 and x2 passes through the upper processing liquid nozzle 30 placed in the processing position correctly in the difference image. Thus, in FIG. 17, a part of a relatively high tone value corresponds to the upper processing liquid nozzle 30 placed in the processing position correctly. The setting part 93 specifies a coordinate y1 at an end portion of the part of the high tone value, specifically a position where the tone value decreases steeply. The coordinate y1 is the coordinate of the tip of the upper processing liquid nozzle 30 placed in the processing position correctly in the difference image. Thus, the coordinate y1 is also the coordinate of the tip of the upper processing liquid nozzle 30 in the nozzle position standard image.

In this way, the setting part 93 specifies the coordinates of the opposite ends in the width direction and the coordinate of the tip of the upper processing liquid nozzle 30 based on the tone value profiles in the difference image showing the difference between the nozzle position standard image and the reference image. The setting part 93 determines the coordinates of the reference pattern RP in the nozzle position standard image based on the specified coordinates of the opposite ends in the width direction and the specified coordinate of the tip of the upper processing liquid nozzle 30. More specifically, the setting part 93 gives some margin to each of the coordinates x1 and x2 of the opposite ends of the upper processing liquid nozzle 30 in the width direction in the nozzle position standard image and sets a resultant coordinate x1−α and a resultant coordinate x2+α as the coordinates of the opposite ends of the reference pattern RP in the width direction. Further, the setting part 93 sets a coordinate y1−β and a coordinate y1+γ as the coordinates of the opposite ends of the reference pattern RP in the vertical direction that are spaced by respective distances from the coordinate y1 of the tip of the upper processing liquid nozzle 30 in the nozzle position standard image. Specifying the coordinates of the opposite ends in the width direction and those of the opposite ends in the vertical direction determines the reference pattern RP in the form of a rectangular region.

In this way, the setting part 93 specifies the coordinates of the upper processing liquid nozzle 30 in the nozzle position standard image to set a rectangular region including the tip of the upper processing liquid nozzle 30 as the reference pattern RP. The reference pattern RP itself set by the setting part 93 is the same as that of the first preferred embodiment shown in FIG. 8. As shown in FIG. 8, the reference pattern RP includes the tip portion of the upper processing liquid nozzle 30. The reference pattern RP cut out by the setting part 93 is stored into the storage part 92 of the controller 9 together with the coordinates in the nozzle position standard image (the coordinates x1−α and x2+α of the opposite ends in the width direction and the coordinates y1−β and y1+γ of the opposite ends in the vertical direction) (step S34).

Next, the setting part 93 sets a threshold for determination of position abnormality (step S35). The threshold set in this step is used to determine position abnormality of the upper processing liquid nozzle 30 (step S26 of FIG. 7). This threshold is for displacement between a nozzle position in the reference pattern RP in the nozzle position standard image taken in step S32 and a nozzle position in an image specified in step S25. By setting the threshold smaller in step S35, the position of the upper processing liquid nozzle 30 is determined to be abnormal more easily even if displacement between the nozzle positions in these images is small. Specifically, a criterion for the determination becomes stricter. The setting part 93 sets a prescribed value (such as 2 mm) as the threshold for determination of position abnormality. The threshold set in step S35 is stored into the storage part 92.

Next, a processing liquid is discharged tentatively from the upper processing liquid nozzle 30 placed in the proper processing position correctly and the camera 70 takes images of the imaging region PA at regular intervals to obtain a series of images (step S36). Specifically, the camera 70 takes moving images before discharge of the processing liquid from the upper processing liquid nozzle 30 placed in the processing position correctly is started and while the processing liquid is discharged. The multiple images taken in step S36 are stored into the storage part 92.

Next, the setting part 93 sets a discharge determination region in the image taken in step S32 (step S37). As illustrated in FIG. 8, the image of the imaging region PA taken by the camera 70 includes not only the tip and its vicinity of the upper processing liquid nozzle 30 but also a substrate W held on the spin chuck 20 or a member inside the cleaning unit 1, for example. It is preferable that such a background have lowest possible influence on determination of discharge of a processing liquid from the upper processing liquid nozzle 30. In particular, influence of an image of a processing liquid reflected at a surface of a substrate W should be eliminated. In response, in step S37, a discharge determination region SP is set in the image of the imaging region PA taken by the camera 70. The discharge determination region SP includes a columnar part of the processing liquid discharged from the tip of the upper processing liquid nozzle 30 to reach a substrate W held on the spin chuck 20.

The setting part 93 adds or subtracts some margin to or from a discharge width of the upper processing liquid nozzle 30 to determine the width of the discharge determination region SP. The setting part 93 adds or subtracts some margin to or from a distance between the tip of the upper processing liquid nozzle 30 and the substrate W held on the spin chuck 20 to determine the length of the discharge determination region SP. By specifying the width and the length, the discharge determination region SP of a rectangular shape is determined. The discharge width of the upper processing liquid nozzle 30 and the distance between the tip of the upper processing liquid nozzle 30 and the substrate W held on the spin chuck 20 are both prescribed values.

The setting part 93 sets the discharge determination region SP of the specified width and length on the side of the tip of the upper processing liquid nozzle 30 (lower side) where the processing liquid is to be discharged in the nozzle position standard image. The coordinates (x1, y1) and (x2, y1) of the tip of the upper processing liquid nozzle 30 are determined during the aforementioned cutting out of the reference pattern RP. The setting part 93 sets the discharge determination region SP relative to these coordinates of the tip of the upper processing liquid nozzle 30 to specify the coordinates of the discharge determination region SP.

In this way, the setting part 93 sets the discharge determination region SP relative to the upper processing liquid nozzle 30 in the nozzle position standard image based on the discharge width of the upper processing liquid nozzle 30 and the distance between the tip of the upper processing liquid nozzle 30 and the substrate W held on the spin chuck 20. The discharge determination region SP includes at least a columnar part of the processing liquid discharged from the tip of the upper processing liquid nozzle 30 to reach the substrate W held on the spin chuck 20 in the nozzle position standard image. The discharge determination region SP set by the setting part 93 is stored into the storage part 92 of the controller 9. Unlike the aforementioned reference pattern RP, the discharge determination region SP set in this step is not an image itself but it is a region in the image of the imaging region PA taken by the camera 70. The discharge determination region SP is represented as coordinates indicating the rectangular shape of the discharge determination region SP.

After setting the discharge determination region SP, the setting part 93 sets a threshold for discharge determination (step S38). The threshold set in this step is used to determine discharge of a processing liquid (step S28 of FIG. 7). This threshold is for a difference between an image taken by the camera 70 before discharge of a processing liquid and an image taken by the camera 70 after the discharge. By setting this threshold smaller, the presence of discharge of a processing liquid from the upper processing liquid nozzle 30 is determined more easily even if the difference is small.

The setting part 93 sets the threshold for discharge determination using the series of images taken successively in step S36 before discharge of the processing liquid from the upper processing liquid nozzle 30 is started and while the processing liquid is discharged. The setting part 93 calculates the sum of the absolute values of differences between the tone values of all pixels in the discharge determination region SP in each of the multiple images taken in step S36 and those of corresponding pixels in the discharge determination region SP in the nozzle position standard image. The multiple images obtained in step S36 include an image taken when the processing liquid is not discharged from the upper processing liquid nozzle 30 and an image taken when the processing liquid is discharged.

The images taken in step S36 before discharge of the processing liquid from the upper processing liquid nozzle 30 is started and while the processing liquid is discharged are the same as those shown in FIGS. 10A and 10B. FIG. 10A shows the discharge determination region SP in an image taken when the processing liquid is not discharged from the upper processing liquid nozzle 30. FIG. 10B shows the discharge determination region SP in an image taken when the processing liquid is discharged from the upper processing liquid nozzle 30.

The setting part 93 calculates a difference between the discharge determination region SP in the image of the imaging region PA taken by the camera 70 when the processing liquid is not discharged from the upper processing liquid nozzle 30 and the discharge determination region SP in the nozzle position standard image. Specifically, the setting part 93 calculates the sum of the absolute values of differences between the tone values of all pixels forming FIG. 10A and those of corresponding pixels in the nozzle position standard image. Likewise, the setting part 93 calculates a difference between the discharge determination region SP in the image of the imaging region PA taken by the camera 70 when the processing liquid is discharged from the upper processing liquid nozzle 30 and the discharge determination region SP in the nozzle position standard image. Specifically, the setting part 93 calculates the sum of the absolute values of differences between the tone values of all pixels forming FIG. 10B and those of corresponding pixels in the nozzle position standard image.

FIG. 18 explains setting of the threshold for discharge determination. The vertical axis of FIG. 18 shows the sum of the absolute values of differences in a pixel tone value. The horizontal axis of FIG. 18 shows respective numbers of the images taken successively in step S36. Images at a comparatively early stage out of the multiple images obtained successively in step S36 are those taken when the processing liquid is not discharged from the upper processing liquid nozzle 30 (FIG. 10A). A plot formed before an image number N1 of FIG. 18 shows the sum of differences between the discharge determination region SP in each of these images taken when the processing liquid is not discharged from the upper processing liquid nozzle 30 and the discharge determination region SP in the nozzle position standard image. These sums are C1 at a maximum.

Images at a comparatively later stage out of the multiple images obtained successively in step S36 are those taken when the processing liquid is discharged from the upper processing liquid nozzle 30 (FIG. 10B). A plot formed after the image number N1 of FIG. 18 shows the sum of differences between the discharge determination region SP in each of these images taken when the processing liquid is discharged from the upper processing liquid nozzle 30 and the discharge determination region SP in the nozzle position standard image. These sums are C2 at a minimum.

The setting part 93 sets a value intermediate between the maximum C1 and the minimum C2 as a threshold TH. The maximum C1 is the maximum of the difference between the discharge determination region SP in the image taken by the camera 70 when the processing liquid is not discharged from the upper processing liquid nozzle 30 and the discharge determination region SP in the nozzle position standard image. The minimum C2 is the minimum of the difference between the discharge determination region SP in the image taken by the camera 70 when the processing liquid is discharged from the upper processing liquid nozzle 30 and the discharge determination region SP in the nozzle position standard image. The intermediate value may be an average of the maximum C1 and the minimum C2 ((C1+C2)/2), for example. The intermediate value may alternatively be an arbitrary value within a given range with respect to this average. The threshold TH set by the setting part 93 is stored into the storage part 92.

The advance preparation (setting of the parameter for determination) for the upper processing liquid nozzle 30 is made in the aforementioned way. Advance preparation same as that shown in steps S31 to S38 is made for the other upper processing liquid nozzles 60 and 65 (step S39). This advance preparation is only required to be made in advance during teaching. Once the advance preparation is made, it is not required to be made repeatedly in the absence of change in a teaching position. The aforementioned advance preparation is not required for the lower processing liquid nozzle 28 in a fixed position.

After the parameter for determination is set as shown in FIG. 14, a target substrate W is processed by a procedure same as that of the first preferred embodiment (FIG. 7). Meanwhile, in the second preferred embodiment, the determination process of FIG. 7 proceeds using the parameter for determination (various thresholds and others) set by the setting part 93 according to the procedure of FIG. 14.

In the second preferred embodiment, comparison is also made between a discharge standard image of the imaging region PA taken by the camera 70 before a processing liquid is discharged from the upper processing liquid nozzle 30 having moved to the processing position and a monitor target image of the imaging region PA taken by the camera 70 thereafter to determine discharge of the processing liquid from the upper processing liquid nozzle 30. The discharge standard image is obtained each time a new target substrate W transported into the cleaning unit 1 is held on the spin chuck 20 and the upper processing liquid nozzle 30 moves to the processing position.

An image of the imaging region PA taken by the camera 70 includes not only the tip and its vicinity of the upper processing liquid nozzle 30 but also a substrate W held on the spin chuck 20 or a member inside the cleaning unit 1, for example. To eliminate the influence of such a background, particularly the influence of an image of a processing liquid reflected at a surface of a substrate W as thoroughly as possible, the discharge determination region SP is set in advance by the setting part 93 and a difference in the discharge determination region SP between the discharge standard image and the monitor target image is compared to the threshold.

Meanwhile, as shown in FIG. 8, an image of a surface of a substrate W held on the spin chuck 20 still remains even in the discharge determination region SP. As described above, various films including a resist film and an insulating film are deposited on the surface of the substrate W to form a pattern. As a result, a surface reflectance differs largely depending on the type of the substrate W.

In the second preferred embodiment, the discharge standard image is obtained each time a new target substrate W is held on the spin chuck 20 and the upper processing liquid nozzle 30 moves to the processing position. Thus, the discharge standard image and the monitor target image are to include the same image of a surface of a substrate W as a background. This eliminates the influence of this background on a difference between the discharge standard image and the monitor target image independently of the level of the surface reflectance of the substrate W. As a result, like in the first preferred embodiment, discharge of a processing liquid from the upper processing liquid nozzle 30 can be determined reliably independently of the type of a target substrate W.

In addition to determining discharge of a processing liquid, the determining part 91 determines position abnormality of the upper processing liquid nozzle 30 having moved to the processing position. Due to an adjustment error caused during maintenance or temporal change, a processing liquid may be discharged from the upper processing liquid nozzle 30 having moved to a position displaced from the teaching position. This makes it impossible to achieve an originally expected result to cause a processing failure. In the second preferred embodiment, determining position abnormality of the upper processing liquid nozzle 30 makes it possible to detect displacement of the upper processing liquid nozzle 30. This can prevent a processing failure to be caused by such displacement.

In the second preferred embodiment, the setting part 93 of the controller 9 sets the reference pattern RP, the discharge determination region SP, and the thresholds required for determination of position abnormality of the upper processing liquid nozzle 30 and determination of discharge of a processing liquid. Specifically, the setting part 93 automatically sets the reference pattern RP, the discharge determination region SP, and the thresholds. Thus, even if an operator of the apparatus does not have knowledge about image processing or an algorithm for determination or is not familiar with such image processing or such an algorithm sufficiently, determination of position abnormality of the upper processing liquid nozzle 30 and determination of discharge of a processing liquid can be made stably and reliably.

<Third Preferred Embodiment>

A third preferred embodiment of the present invention is described next. The structure of a substrate processing apparatus 100 of the third preferred embodiment is completely the same as that of the first preferred embodiment. A general procedure of processing a substrate W in the third preferred embodiment is also the same as the procedure in the first preferred embodiment. The third preferred embodiment differs from the first preferred embodiment in the technique of determining discharge of a processing liquid. In the third preferred embodiment, the presence or absence of discharge of a processing liquid is determined based on a dispersion of the brightness levels of pixels.

In the third preferred embodiment, when a processing liquid is discharged from the upper processing liquid nozzle 30 to the upper surface of a substrate W, the determining part 91 also performs certain image processing on an image taken by the camera 70 to determine the presence or absence of discharge of the processing liquid. This technique is described in detail below. The determination mentioned herein is about discharge of a processing liquid from the upper processing liquid nozzle 30. Meanwhile, the same determination may be applied to discharge from the other upper processing liquid nozzles 60 and 65.

A flowchart itself showing a procedure of advance preparation for determination and a flowchart itself showing a procedure of the determination are the same as that shown in FIG. 6 and that shown in FIG. 7 respectively. Thus, these procedures are described below by referring to FIGS. 6 and 7. Meanwhile, in the third preferred embodiment, each step in each of the flowcharts is different from a corresponding step of the first preferred embodiment.

For teaching of the upper processing liquid nozzle 30 during maintenance, for example, the upper processing liquid nozzle 30 is first moved to a teaching position (step S11). The teaching mentioned herein is to teach the upper processing liquid nozzle 30 to operate properly. This teaching corrects a position where the upper processing liquid nozzle 30 stops to a proper position (teaching position). Thus, by moving the upper processing liquid nozzle 30 to the teaching position during the teaching, the upper processing liquid nozzle 30 is placed in the proper processing position correctly. The proper processing position is a position that achieves requested substrate processing if a processing liquid is discharged from the upper processing liquid nozzle 30 in this processing position.

When the upper processing liquid nozzle 30 has moved to the proper processing position, the camera 70 takes an image of an imaging region including the tip of the upper processing liquid nozzle 30 (step S12). FIG. 19 shows an example of an image (still image) of the imaging region including the tip of the upper processing liquid nozzle 30 in the processing position taken by the camera 70. An imaging region PA includes at least the tip of the upper processing liquid nozzle 30 in the processing position above a substrate W held on the spin chuck 20. The imaging region PA further includes a surface of the substrate W held on the spin shuck 20 as a background of the upper processing liquid nozzle 30. A substrate W is not always held on the spin chuck 20 during the maintenance. Thus, the imaging region PA is not always required to include a substrate W.

Next, a reference pattern is cut out from the image taken in step S12 (step S13). When the image is taken in step S12, the upper processing liquid nozzle 30 is placed in the proper processing position correctly as a result of the teaching. Thus, the image taken by the camera 70 in step S12 can be a nozzle position standard image showing the proper processing position of the upper processing liquid nozzle 30. In step S13, a partial image region including the tip portion of the upper processing liquid nozzle 30 is cut out as a reference pattern RP from the nozzle position standard image as shown in FIG. 19. As an example, an operator may cut out this reference pattern RP by manually designating a region to become the reference pattern RP while seeing the image taken in step S12 during the teaching. The cut out reference pattern RP is stored together with its coordinates in the image into the storage part 92 of the controller 9 (step S14).

Next, the operator sets a threshold for determination of position abnormality (step S15). The threshold set in this step is used to determine position abnormality of the upper processing liquid nozzle 30 (step S26 of FIG. 7). This threshold is for displacement between a nozzle position in the reference pattern RP in the nozzle position standard image taken in step S12 and a nozzle position in an image specified in step S25. By setting this threshold smaller, the position of the upper processing liquid nozzle 30 is determined to be abnormal more easily even if displacement between the nozzle positions in these images is small. Specifically, a criterion for the determination becomes stricter. The threshold set in step S15 is stored into the storage part 92.

Next, a discharge determination region is set in the image taken in step S12 (step S16). As illustrated in FIG. 19, the image of the imaging region PA taken by the camera 70 includes not only the tip and its vicinity of the upper processing liquid nozzle 30 but also a substrate W held on the spin chuck 20 or a member inside the cleaning unit 1, for example. It is preferable that such a background have lowest possible influence on determination of discharge of a processing liquid from the upper processing liquid nozzle 30. In response, in step S16, a discharge determination region SP is set in the image of the imaging region PA taken by the camera 70. The discharge determination region SP is a part of a region to be covered with a processing liquid discharged from the upper processing liquid nozzle 30. In the third preferred embodiment, the discharge determination region SP is set in a part of a column of the processing liquid formed in a period from when the processing liquid is discharged from the upper processing liquid nozzle 30 in the proper processing position to when the processing liquid reaches a substrate W held on the spin chuck 20. Specifically, as shown in FIG. 19, the discharge determination region SP is set directly below the tip of the upper processing liquid nozzle 30 in the proper processing position. The operator can also set this discharge determination region SP by designating the region manually while seeing the image taken in step S12. The set discharge determination region SP is stored into the storage part 92 of the controller 9. Unlike the aforementioned reference pattern RP, the discharge determination region SP set in this step is not an image itself but it is a region in the image of the imaging region PA taken by the camera 70. The discharge determination region SP is represented as coordinate data indicating the rectangular shape of the discharge determination region SP of FIG. 19, for example.

After setting the discharge determination region SP, the operator sets a threshold for discharge determination (step S17). The threshold set in this step is used to determine discharge of a processing liquid (step S28 of FIG. 7). This threshold is for a standard deviation of the brightness levels of pixels forming the discharge determination region SP. As described in detail later, by setting this threshold larger, the presence of discharge of a processing liquid from the upper processing liquid nozzle 30 is determined more easily. The threshold set in step S17 is stored into the storage part 92.

The advance preparation for the upper processing liquid nozzle 30 is made in the aforementioned way. Advance preparation same as that shown in steps S11 to S17 is made for the other upper processing liquid nozzles 60 and 65 (step S18). This advance preparation is only required to be made in advance during teaching. Once the advance preparation is made, it is not required to be made repeatedly in the absence of change in a teaching position. The aforementioned advance preparation is not required for the lower processing liquid nozzle 28 in a fixed position.

The following describes a procedure of processing a target substrate W by referring to FIG. 7 that is to be taken after the advance preparation of FIG. 6 is made. First, the target substrate W is transported into the cleaning unit 1 by the main transport robot 103 (step S21). The transported substrate W is held in a horizontal posture on the spin chuck 20. At the same time, the processing cup 40 moves up and down to reach a given height.

After the new target substrate W is held on the spin chuck 20, the upper processing liquid nozzle 30 starts moving from the standby position toward the processing position (step S22). The upper processing liquid nozzle 30 moves in response to control on the nozzle base 33 by the controller 9 according to a predetermined recipe (describing a procedure and a condition for processing a substrate W). If the recipe describes discharge of a processing liquid from the upper processing liquid nozzle 30 to last a given period of time or more (such as five seconds or more), the controller 9 instructs the determining part 91 to make discharge determination to coincide with timing of start of the movement of the upper processing liquid nozzle 30. The timing for the controller 9 to instruct discharge determination is not required to be strictly the same as the timing of start of the movement of the upper processing liquid nozzle 30. Meanwhile, it is preferable that the controller 9 instruct discharge determination in good time so as to allow the determining part 91 to execute step S23 and its subsequent steps before the upper processing liquid nozzle 30 stops moving.

The determining part 91 having been instructed to make discharge determination makes the camera 70 start taking images successively (step S23). The camera 70 takes images of the imaging region PA successively at regular intervals. As an example, the camera 70 takes images successively at intervals of 33 milliseconds (30 frames per second). Specifically, the camera 70 starts taking moving images from a point in time when the new target substrate W is held on the spin chuck 20 and the upper processing liquid nozzle 30 starts moving from the standby position toward the processing position. A point in time when the camera 70 starts taking images successively corresponds to a point in time when the upper processing liquid nozzle 30 starts moving from the standby position. Thus, the upper processing liquid nozzle 30 has not reached the imaging region PA in this point in time.

After the camera 70 starts taking images successively, the determining part 91 determines whether the upper processing liquid nozzle 30 has stopped moving (step S24). The movement itself of the upper processing liquid nozzle 30 proceeds in response to control on the nozzle base 33 by the controller 9 according to the aforementioned recipe. Stop of the movement is also controlled by the controller 9. The determining part 91 determines based on multiple images taken successively by the camera 70 whether the upper processing liquid nozzle 30 has stopped moving independently of the control by the controller 9. More specifically, the determining part 91 calculates every difference between images of the imaging region PA taken successively by the camera 70. Based on whether this difference is a fixed value or less, the determining part 91 determines whether the upper processing liquid nozzle 30 has stopped moving. Calculating a difference between successive images means obtaining the sum of the absolute values of differences between the tone values of all pixels in one image out of multiple images taken successively and those of all pixels in a next image out of these multiple images.

Figure 20:
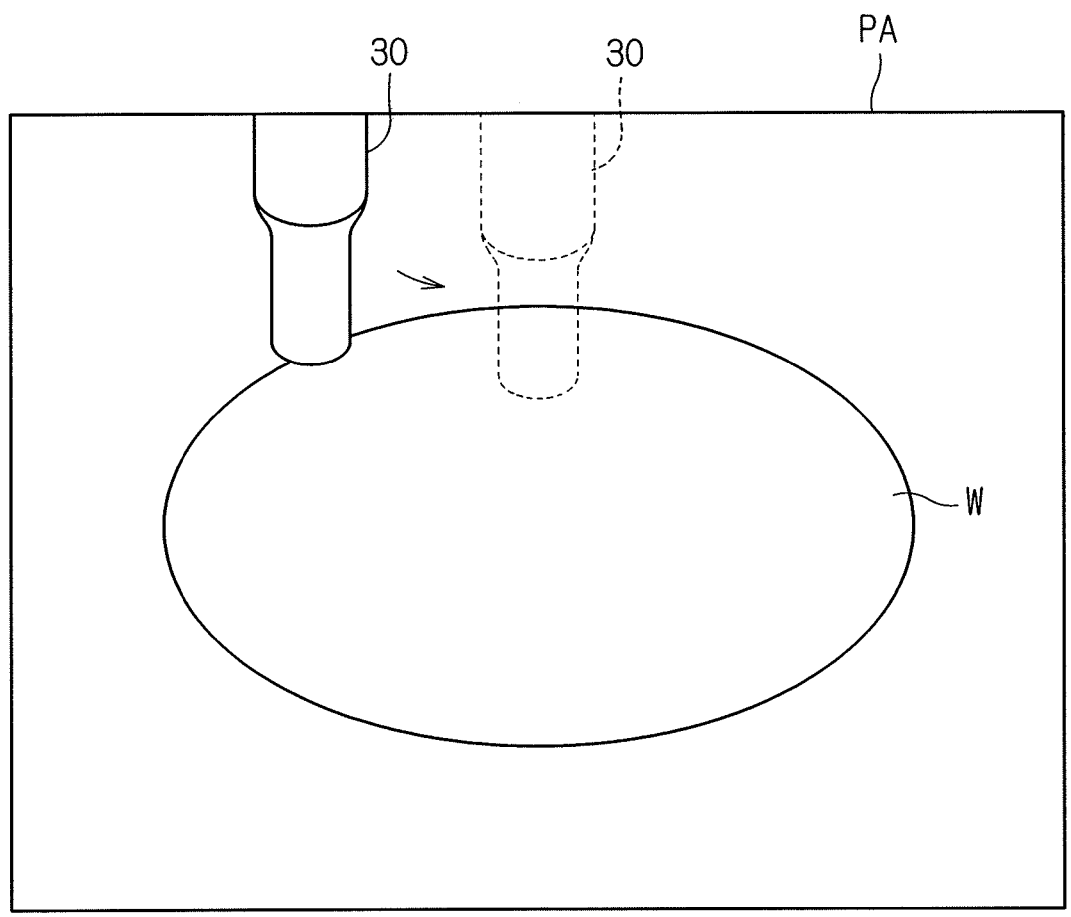
FIG. 20 shows movement of the upper processing liquid nozzle in the imaging region.

FIG. 20 shows movement of the upper processing liquid nozzle 30 in the imaging region PA. If the camera 70 takes images of the imaging region PA successively while the upper processing liquid nozzle 30 moves in the imaging region PA, the position of the upper processing liquid nozzle 30 differs between one image and a next image. A residual image of the upper processing liquid nozzle 30 appears depending on a difference between these images. In contrast, if the camera 70 takes images of the imaging region PA successively after the upper processing liquid nozzle 30 stops moving in the imaging region PA (dotted line position of FIG. 20), the position of the upper processing liquid nozzle 30 in one image and that in a next image are the same. A residual image of the upper processing liquid nozzle 30 disappears depending on a difference between these images. Thus, if the sum of differences between the tone values of all pixels in an image (in one image) of the imaging region PA and those of pixels in a successive image (in a next image) of the imaging region PA taken successively by the camera 70 is the fixed value or less, the determining part 91 determines that the upper processing liquid nozzle 30 has stopped moving. To prevent erroneous determination due to noise or the like, the determining part 91 may calculate every difference between one image and a next image out of five successive images (in this case, four differences are calculated) and then determine that the upper processing liquid nozzle 30 has stopped moving if all these differences are the fixed value or less.

Next, the determining part 91 specifies an image as an image for nozzle position determination (step S25). The image specified in this step is one of those taken successively by the camera 70 and obtained when the determining part 91 determines that the upper processing liquid nozzle 30 has stopped moving in step S24. The specified image for nozzle position determination is stored into the storage part 92 of the controller 9. This image for nozzle position determination is an image of the imaging region PA taken when the upper processing liquid nozzle 30 reaches the processing position and stops. The image for nozzle position determination may be any image of the imaging region PA taken after the upper processing liquid nozzle 30 is determined to have stopped moving in step S24.

Next, the determining part 91 compares the nozzle position standard image and the image for nozzle position determination to determine whether there is position abnormality of the upper processing liquid nozzle 30 in the processing position (step S26). The nozzle position standard image is an image of the imaging region PA taken by the camera 70 when the upper processing liquid nozzle 30 is placed in the processing position correctly during the teaching. The image for nozzle position determination is an image of the imaging region PA taken by the camera 70 when the target substrate W is held on the spin chuck 20 and the upper processing liquid nozzle 30 reaches the processing position and stops. Thus, comparing the nozzle position standard image and the image for nozzle position determination makes it possible to determine whether a position above the target substrate W where the upper processing liquid nozzle 30 has moved and stopped is a proper processing position.

More specifically, the determining part 91 compares the reference pattern RP cut out from the nozzle position standard image in step S13 and an image of a partial region in the image for nozzle position determination corresponding to the reference pattern RP to calculate a difference between the respective coordinates of the upper processing liquid nozzle 30 in these images (displacement). These images can be compared by a publicly-known pattern matching technique. If the displacement of the upper processing liquid nozzle 30 calculated by the pattern matching is the threshold or more set in step S15, the determining part 91 determines that the position of the upper processing liquid nozzle 30 is abnormal. If the position of the upper processing liquid nozzle 30 is determined to be abnormal, the controller 9 performs certain process responsive to the abnormality (as an example, the controller 9 issues an alarm or suspends the processing). If the calculated displacement of the upper processing liquid nozzle 30 is smaller than the threshold set in step S15, the determining part 91 determines that there is no abnormality in the position of the upper processing liquid nozzle 30.

Under control by the controller 9, the substrate W is rotated while the upper processing liquid nozzle 30 is moved to the processing position. Typically, discharge of the processing liquid from the upper processing liquid nozzle 30 is started after the upper processing liquid nozzle 30 reaches the processing position and stops. Then, the determining part 91 determines the presence or absence of discharge of the processing liquid from the upper processing liquid nozzle 30 based on images taken successively by the camera 70 after the upper processing liquid nozzle 30 stops.

The determining part 91 shifts the discharge determination region SP for determination of discharge of the processing liquid (step S27). The discharge determination region SP is set in the nozzle position standard image in step S16 as a part of a region to be covered with the processing liquid discharged from the upper processing liquid nozzle 30. In step S26 described above, a difference between the position of the upper processing liquid nozzle 30 in the nozzle position standard image and that in the image for nozzle position determination is calculated. Based on a result of the calculation, the determining part 91 shifts the discharge determination region SP in step S27. Specifically, the determining part 91 moves the discharge determination region SP by an amount corresponding to the displacement calculated in step S26.

The camera 70 continues taking images of the imaging region PA successively after the upper processing liquid nozzle 30 is determined to have stopped moving in step S24. Specifically, after starting taking images of the imaging regions PA successively (step S23) simultaneously with start of movement of the upper processing liquid nozzle 30, the camera 70 continues taking images successively at regular intervals.

Based on images of the imaging region PA taken successively by the camera 70 after the upper processing liquid nozzle 30 is determined to have stopped moving in step S24, the determining part 91 determines discharge of the processing liquid from the upper processing liquid nozzle 30 (step S28). The imaging region PA includes the discharge determination region SP (see FIG. 19). Thus, taking images of the imaging region PA successively means taking images of the discharge determination region SP successively by the camera 70. Images of the discharge determination region SP taken successively by the camera 70 after the upper processing liquid nozzle 30 stops moving become images for discharge determination to be used for determining discharge of the processing liquid. The determining part 91 compares a standard deviation of the brightness levels of pixels in each image for discharge determination and the threshold set in step S17 to determine the presence or absence of discharge of the processing liquid from the upper processing liquid nozzle 30.

The discharge determination region SP is part of a region to be covered with a processing liquid discharged from the upper processing liquid nozzle 30 in the nozzle position standard image. As viewed from the camera 70, the discharge determination region SP is a part of a region to appear in front of a region where the discharged processing liquid appears as a background. In the third preferred embodiment, the discharge determination region SP is set in a part of a column of the processing liquid formed by discharge of the processing liquid from the upper processing liquid nozzle 30 toward a substrate W, specifically a part of the column of the processing liquid appearing in front of the substrate W as a background. Thus, when the processing liquid is discharged normally from the upper processing liquid nozzle 30, the processing liquid is to appear in the entire discharge determination region SP viewed from the camera 70. In contrast, when the processing liquid is not discharged from the upper processing liquid nozzle 30, a surface of the substrate W held on the spin chuck 20 appears in the entire discharge determination region SP viewed from the camera 70. The surface of the substrate W is a mirror surface of a high reflectance. Thus, when the processing liquid is not discharged from the upper processing liquid nozzle 30, a structure such as one inside the chamber 10 reflected at the surface of the substrate W appears in the discharge determination region SP viewed from the camera 70.

Figure 21:
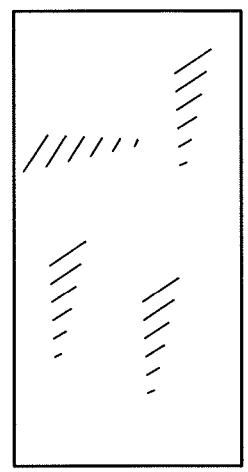
FIG. 21 shows an image for discharge determination taken when a processing liquid is not discharged from the upper processing liquid nozzle.
Figure 22:
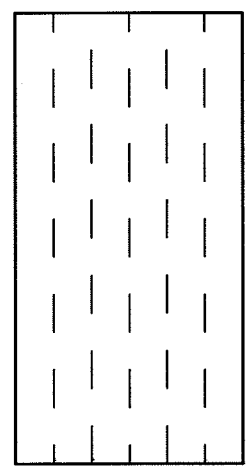
FIG. 22 shows an image for discharge determination taken when a processing liquid is discharged from the upper processing liquid nozzle.

As a result, as shown in FIG. 21, when the processing liquid is not discharged from the upper processing liquid nozzle 30, a structure such as one inside the chamber 10 appears as an image element in the image for discharge determination of the discharge determination region SP taken by the camera 70. In contrast, as shown in FIG. 22, when the processing liquid is discharged from the upper processing liquid nozzle 30, only the processing liquid being discharged appears in the image for discharge determination of the discharge determination region SP taken by the camera 70.

The determining part 91 performs arithmetic image processing for determination of discharge of the processing liquid on each of the multiple images for determination of the discharge determination region SP taken successively by the camera 70 after the upper processing liquid nozzle 30 is determined to have stopped moving in step S24. More specifically, the determining part 91 calculates a standard deviation σ of the brightness levels of pixels in the image for determination and compares the resultant standard deviation σ and the threshold set in step S17, thereby determining the presence or absence of discharge of the processing liquid from the upper processing liquid nozzle 30 according to formula (1) as follows:

$$\sigma = \sqrt{\frac{(S_1 - [\![m]\!])^2 + (S_2 - [\![m]\!])^2 + (S_3 - [\![m]\!])^2 + \ldots + (S_n - [\![m]\!])^2}{n}} \quad (1)$$

In formula (1), n is the number of pixels in the image for determination, $S_1, S_2, S_3, \ldots$ and $S_n$ are the brightness levels of corresponding pixels (corresponding to the tone values of pixels taken by the camera 70), and m is an average of the brightness levels of the pixels in the image for determination. FIG. 23 shows examples of the brightness levels of the pixels in the image for determination taken in the absence of discharge of the processing liquid as shown in FIG. 21. In the absence of discharge of the processing liquid, a structure such as one inside the chamber 10 appears as an image element in the image for discharge determination. This forms a pattern in the image for discharge determination to generate a large dispersion (wide range of variation) among the brightness levels of the pixels. As a result, the standard deviation σ of the brightness levels of the pixels in the image for discharge determination becomes large. In the example of FIG. 23, the standard deviation σ is 23.1.

FIG. 24 shows examples of the brightness levels of pixels in the image for determination taken in the presence of discharge of the processing liquid as shown in FIG. 22. In the presence of discharge of the processing liquid, only the processing liquid being discharged appears in the image for discharge determination. This makes the brightness levels of the pixels in the image for discharge determination uniform to reduce a dispersion. As a result, the standard deviation σ of the brightness levels of the pixels in the image for discharge determination becomes small. In the example of FIG. 24, the standard deviation σ is 5.4.

Referring to the aforementioned standard deviation σ illustrated in each of FIGS. 23 and 24, the standard deviation σ of the brightness levels of pixels in the image for discharge determination taken when the processing liquid is not discharged from the upper processing liquid nozzle 30 is substantially within a range from 20 to 30. Meanwhile, the standard deviation σ of the brightness levels of pixels in the image for discharge determination taken when the processing liquid is discharged from the upper processing liquid nozzle 30 is substantially within a range from 5 to 10. Thus, the threshold for determination of discharge of a processing liquid is preferably set in a range from 10 to 20 in step S17. In the third preferred embodiment, this threshold is set at 15.

If the standard deviation σ of the brightness levels of pixels in the image for discharge determination is smaller than 15 as in the example of FIG. 24, the determining part 91 determines that the processing liquid is discharged from the upper processing liquid nozzle 30. If the standard deviation σ of the brightness levels of pixels in the image for discharge determination is larger than 15 as in the example of FIG. 23, the determining part 91 determines that the processing liquid is not discharged from the upper processing liquid nozzle 30. If the standard deviation σ of the brightness levels is the same as the threshold, the determining part 91 may make determination in either way.

If a condition where the processing liquid is determined to be discharged from the upper processing liquid nozzle 30 lasts for two seconds or more, specifically if the processing liquid is determined to be discharged based on the fact that the standard deviation σ of brightness levels continues to be smaller than the threshold about 60 or more successive images for discharge determination taken at intervals of 33 milliseconds, the determining part 91 determines that the processing liquid is discharged stably and reliably from the upper processing liquid nozzle 30. In contrast, if the standard deviation a does not become smaller than the threshold after elapse of a given period of time (five seconds, for example) from when the upper processing liquid nozzle 30 is determined to have stopped moving, the determining part 91 determines that the processing liquid is not discharged from the upper processing liquid nozzle 30 and determines that there is abnormality in the discharge of the processing liquid. A result of the determination by the determining part 91 about discharge of the processing liquid may be shown for example on a display provided to the controller 9. If discharge of the processing liquid from the upper processing liquid nozzle 30 is determined to be abnormal, the controller 9 may perform certain process responsive to the abnormality by suspending the processing, for example.

The aforementioned determination is about the upper processing liquid nozzle 30. If the different upper processing liquid nozzle 60 or 65 is to be used, a procedure same as the aforementioned procedure may be taken to make discharge determination about the upper processing liquid nozzle 60 or 65.

In the third preferred embodiment, the standard deviation $\sigma$ of the brightness levels of pixels in the image for discharge determination of the discharge determination region SP taken by the camera 70 is calculated and the resultant standard deviation $\sigma$ is compared to the threshold set in advance, thereby determining the presence or absence of discharge of a processing liquid from the upper processing liquid nozzle 30. Specifically, for determining discharge of a processing liquid, the third preferred embodiment does not require a standard image for comparison taken when the processing liquid is not discharged from the upper processing liquid nozzle 30.

In the third preferred embodiment, discharge of a processing liquid is started after the upper processing liquid nozzle 30 reaches the processing position and stops. Meanwhile, discharge of the processing liquid may be started before the upper processing liquid nozzle 30 reaches the processing position and stops. In an extreme case, discharge of the processing liquid may be started simultaneously with start of movement of the upper processing liquid nozzle 30 from the standby position. Even in this case, according to the third preferred embodiment, a standard image for comparison is not required and the presence or absence of discharge of the processing liquid from the upper processing liquid nozzle 30 can still be determined based on only the image for discharge determination of the discharge determination region SP taken by the camera 70 after the upper processing liquid nozzle 30 is determined to have stopped moving. As a result, discharge of the processing liquid from the upper processing liquid nozzle 30 can be detected reliably.

A phenomenon in which a structure such as one in the chamber 10 is reflected at a surface of a substrate W and then captured by the camera 70 is used that is to occur when a processing liquid is not discharged from the upper processing liquid nozzle 30. Thus, the third preferred embodiment can be achieved by a simple illumination system and an imaging system while eliminating the need for example for controlling an optical path strictly.

The upper processing liquid nozzle 30 is determined to have stopped moving if a difference between successive images of the imaging region PA taken successively by the camera 70 is the fixed value or less. This means stop of the movement of the upper processing liquid nozzle 30 is determined automatically. Thus, after the upper processing liquid nozzle 30 stops moving at the processing position, discharge of a processing liquid from the upper processing liquid nozzle 30 can be determined based on an image taken by the camera 70 without the need for transmitting a dedicated trigger signal. This can simplify a hardware structure relating to determination of discharge of a processing liquid. In addition to determining discharge of a processing liquid, the determining part 91 determines position abnormality of the upper processing liquid nozzle 30 having moved to the processing position. Due to an adjustment error caused during maintenance or temporal change, a processing liquid may be discharged from the upper processing liquid nozzle 30 having moved to a position displaced from the teaching position. This makes it impossible to achieve an originally expected result to cause a processing failure. In the third preferred embodiment, determining position abnormality of the upper processing liquid nozzle 30 makes it possible to prevent a processing failure to be caused by displacement of the upper processing liquid nozzle 30.

<Modifications>

In addition to the aforementioned preferred embodiments, various changes can be made to the present invention within a range that does not go out of the substance of the present invention. As an example, in the first and second preferred embodiments, the determining part 91 determines whether the upper processing liquid nozzle 30 has stopped moving based on whether a difference between successive images taken successively by the camera 70 is the fixed value or less. However, this it not given as limitation. The determining part 91 may determine whether the upper processing liquid nozzle 30 has stopped moving by comparing each image and the nozzle position standard image. Specifically, the determining part 91 matches the respective patterns of multiple images of the imaging region PA taken successively by the camera 70 against the pattern of the nozzle position standard image taken during teaching and determines that the upper processing liquid nozzle 30 has stopped moving when change in the coordinate of the upper processing liquid nozzle 30 becomes a fixed value or less. In this case, it is also preferable that the determining part 91 for example match the respective patterns of successive five images against the pattern of the nozzle position standard image and determine that the upper processing liquid nozzle 30 has stopped moving when change in the coordinate of the upper processing liquid nozzle 30 becomes the fixed value or less stably.

Figure 13:
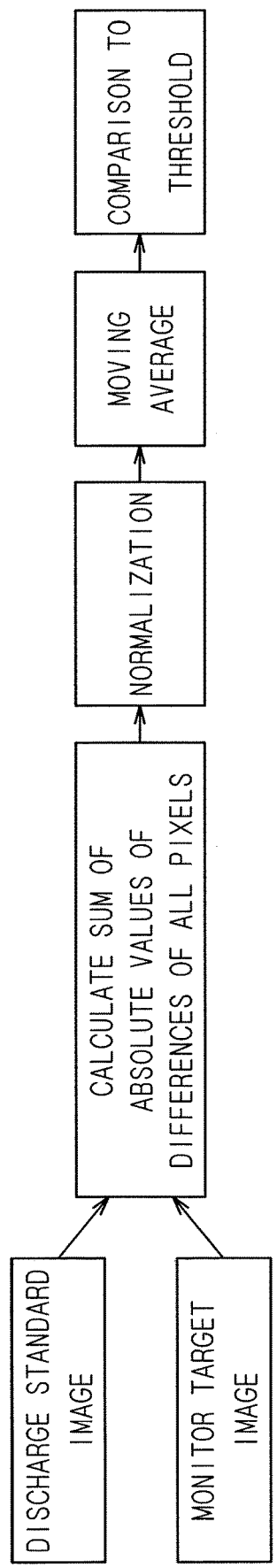
FIG. 13 schematically shows a different example of an algorithm for determination of discharge of a processing liquid.

In the first and second preferred embodiments, discharge of a processing liquid from the upper processing liquid nozzle 30 may be determined based on an algorithm shown in FIG. 13. In this case, like in the first preferred embodiment (FIG. 12), the determining part 91 calculates the sum of the absolute values of differences between the tone values of all pixels in the discharge determination region SP in one of multiple monitor target images and those of corresponding pixels in the discharge determination region SP in the discharge standard image. In the example of FIG. 13, the determining part 91 normalizes the sum of the differences in a pixel tone value by the area of the discharge determination region SP for comparison between the discharge standard image and the monitor target image. Specifically, the determining part 91 divides the sum of the differences in a pixel tone value by the area of the discharge determination region SP to calculate the sum of the differences per unit area. Then, the determining part 91 compares the sum of the differences in a pixel tone value normalized by the area of the discharge determination region SP and the threshold set in advance in step S17, thereby determining discharge of a processing liquid from the upper processing liquid nozzle 30. In the first preferred embodiment, the sum of differences in a pixel tone value is to change in response to change in the size of the discharge determination region SP set in step S16. This necessitates change in the threshold set in step S17. In the example of FIG. 13, the sum of differences in a pixel tone value is normalized by the area of the discharge determination region SP. Thus, even in the presence of change in the size of the discharge determination region SP set in step S16, the threshold set in step S17 is still applicable without having to be changed.

Additionally, in the example of FIG. 13, the determining part 91 calculates a moving average of respective differences of multiple monitor target images of a given number from the discharge standard image and compares the resultant moving average to the threshold. Specifically, the determining part 91 for example calculates the sum of differences in a pixel tone value between each of five successive monitor target images taken most recently and the discharge standard image and calculates an average of these sums of the differences. Then, the determining part 91 compares the average of the sums of the differences in a pixel tone value to the threshold set in advance in step S17 to determine discharge of a processing liquid from the upper processing liquid nozzle 30. If the moving average of the differences is the threshold or more set in step S17, the determining part 91 determines that the processing liquid is discharged from the upper processing liquid nozzle 30. Using such a moving average can relax influence of noise in multiple monitor target images taken successively by the camera 70 or variation among these images, so that discharge can be determined more reliably.

In the second preferred embodiment, the discharge determination region SP is set based on the discharge width of the upper processing liquid nozzle 30 and the distance between the tip of the upper processing liquid nozzle 30 and a substrate W held on the spin chuck 20. Alternatively, the setting part 93 may set the discharge determination region SP based on images taken in step S36. More specifically, the setting part 93 binarizes an image taken when a processing liquid is discharged from the upper processing liquid nozzle 30 (FIG. 10B) out of the images taken in step S36 to extract a columnar part of the discharged processing liquid. Then, the setting part 93 sets the extracted part as the discharge determination region SP. In this case, it is preferable that the camera 70 and the illumination part 71 be arranged on the same side relative to the imaging region PA in order to allow the camera 70 to receive light reflected at the columnar part of the processing liquid.

The images taken in step S36 and stored in the storage part 92 may be used to verify the discharge determination region SP and the threshold TH for discharge determination. More specifically, by using the discharge determination region SP set in step S37 and the threshold TH set in step S38, the determining part 91 makes the discharge determination of step S28 about the images taken by the camera 70 before discharge of a processing liquid from the upper processing liquid nozzle 30 is started and while the processing liquid is discharged and stored into the storage part 92 in step S36. Specifically, simulation is conducted using the images taken in step S36 to examine the validity of the discharge determination region SP and that of the threshold TH. By doing this, the validity of the discharge determination region SP and that of the threshold TH set automatically by the setting part 93 can be examined without the need for actually using the cleaning unit 1.

In the third preferred embodiment, the discharge determination region SP is set in a part of a column of a processing liquid formed by discharge of the processing liquid from the upper processing liquid nozzle 30. However, this is not given as limitation. The discharge determination region SP is only required to be a part of a region where a processing liquid discharged from the upper processing liquid nozzle 30 is to appear. As an example, the discharge determination region SP may be set in a part of a region of a surface of a substrate W covered with a processing liquid having been discharged from the upper processing liquid nozzle 30 and having reached the substrate W to spread over this surface. Setting the discharge determination region SP in this way also makes the processing liquid appear in the entire discharge determination region SP viewed from the camera 70 when the processing liquid is discharged from the upper processing liquid nozzle 30, thereby achieving the same determination as that of the third preferred embodiment. Meanwhile, there is some time lag from when discharge of the processing liquid from the upper processing liquid nozzle 30 is started to when the processing liquid spreads over the surface of the substrate W to cover the surface. Thus, setting the discharge determination region SP in a part of a column of the processing liquid formed by discharge of the processing liquid from the upper processing liquid nozzle 30 as in the third preferred embodiment can detect discharge of the processing liquid more rapidly.

In the third preferred embodiment, the standard deviation σ of the brightness levels of pixels and the threshold is compared to determine the presence or absence of discharge of a processing liquid from the upper processing liquid nozzle 30. The standard deviation σ can be replaced by a different index indicating a dispersion. Examples of the index as an alternative to the standard deviation σ indicating a dispersion include a range defined by a difference between a maximum and a minimum of the brightness levels of pixels and spread indicating a degree of a distribution. Even with these indexes indicating a dispersion except a standard deviation, the presence or absence of discharge of a processing liquid from the upper processing liquid nozzle 30 can still be determined by comparing a dispersion of brightness levels and a threshold set in advance.

Figure 27:
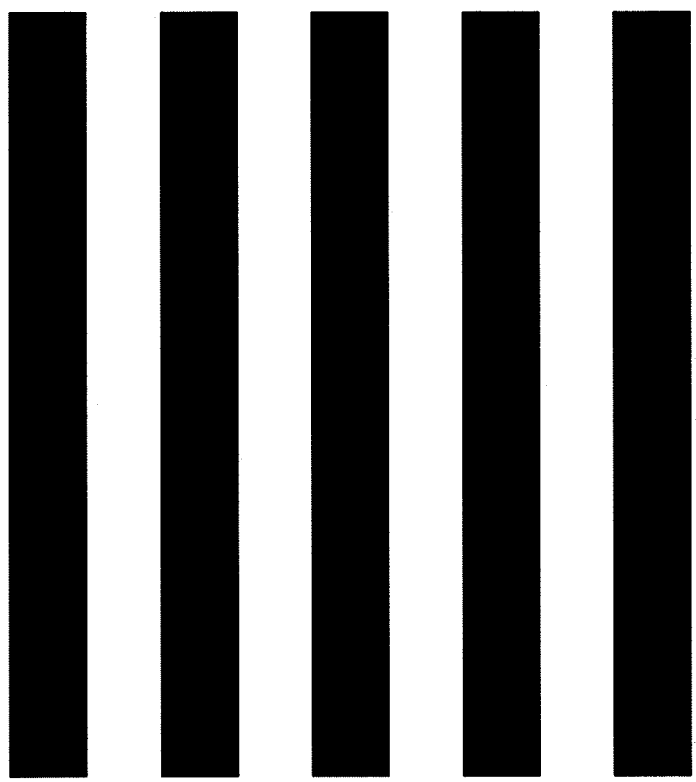

To reliably increase the standard deviation σ of brightness levels of pixels in the image for determination taken in the absence of a processing liquid, a high-contrast pattern may be formed in an area inside the chamber 10 to be reflected at a surface of a substrate W held on the spin chuck 20 and targeted for image taking by the camera 70 when a processing liquid is not discharged from the upper processing liquid nozzle 30. As an example, a high-contrast pattern such as that shown in FIG. 25, 26, or 27 is formed on the inner wall of the chamber 10 to be reflected at the surface of the substrate W and targeted for image taking by the camera 70.

FIG. 25 shows a check pattern as an example of a pattern formed on the inner wall of the chamber 10. FIGS. 26 and 27 show a lattice pattern and a stripe pattern respectively as examples of this pattern. With a pattern such as that shown in FIG. 25, 26, or 27 formed on the inner wall of the chamber 10 to be targeted for image taking indirectly by the camera 70, when a processing liquid is not discharged from the upper processing liquid nozzle 30, a pattern such as that shown in FIG. 25, 26, or 27 reflected at a surface of a substrate W appears in the entire discharge determination region SP viewed from the camera 70. As a result, in the absence of discharge of a processing liquid, a high-contrast pattern such as that shown in FIG. 25, 26, or 27 appears in the image for discharge determination to increase a dispersion of the brightness levels of pixels significantly.

If an area inside the chamber 10 to be reflected at a surface of a substrate W and targeted for image taking by the camera 70 is a wall surface within a pattern, the brightness level of the image for discharge determination becomes uniform to reduce a dispersion of the brightness levels of pixels even in the absence of discharge of a processing liquid. Thus, the presence of discharge of a processing liquid may be determined erroneously. By forming a high-contrast pattern such as that shown in FIG. 25, 26, or 27 on an area inside the chamber 10 to be reflected at a surface of a substrate W and targeted for image taking by the camera 70, a dispersion of the brightness levels of pixels in the image for discharge determination taken in the absence of discharge of a processing liquid can become larger than the threshold reliably. This prevents erroneous determination to make it possible to detect discharge of a processing liquid reliably.

A substrate to be processed by the substrate processing apparatus 100 is not limited to that for semiconductor purposes but it may alternatively be a substrate for use in solar cells or a glass substrate for use in a flat panel display such as a liquid crystal display.

The technique according to the present invention is applicable to an apparatus to perform certain process on a substrate by discharging a processing liquid from a movable nozzle to the substrate. As an example, the technique according to the present invention is applicable not only to the single-wafer cleaning apparatus of the aforementioned preferred embodiments but also to a rotary coating apparatus (spin coater) to coat a substrate with a resist by discharging a photoresist liquid from a nozzle to the substrate being rotated, an apparatus to discharge a remover for removal of a film from a nozzle to a peripheral area of a surface of a substrate on which the film is deposited, or an apparatus to discharge an etching liquid from a nozzle to a surface of a substrate, for example.

While the invention has been described in detail, the foregoing description is in all aspects illustrative and not restrictive. It is therefore understood that numerous modifications and variations can be devised without departing from the scope of the invention.

What is claimed is:

1. A substrate processing method of discharging a processing liquid to a substrate, comprising the steps of:
   (a) holding a new target substrate with a substrate holder;
   (b) after said new target substrate is held by said substrate holder, moving a nozzle from which a processing liquid is discharged from a standby position outside a cup surrounding said substrate holder toward a processing position above said substrate held by said substrate holder;
   (c) taking an image of an imaging region including a tip of said nozzle placed in said processing position with an imaging part; and
   (d) determining discharge of a processing liquid from said nozzle by comparing a first standard image and a monitor target image, said first standard image being an image of said imaging region taken by said imaging part before a processing liquid is discharged from said nozzle having moved to said processing position, said monitor target image being an image of said imaging region taken thereafter by said imaging part,
   wherein in said step (c), said first standard image is obtained each time said substrate holder holds a new target substrate and said nozzle moves to said processing position,
   in said step (c), images of said imaging region are taken successively at given intervals from a point in time when said substrate holder holds a new target substrate and said nozzle starts moving from said standby position toward said processing position, and
   determining that said nozzle has stopped moving, when a difference between successive images of said imaging region taken successively by said imaging part is a fixed value or less.

2. The substrate processing method according to claim 1, wherein
   a determination region is set in advance in an image of said imaging region taken by said imaging part, said determination region including a part of a region from said tip of said nozzle to a substrate held by said substrate holder, and
   in said step (d), a processing liquid is determined to be discharged from said nozzle if a difference between said determination region in said first standard image and said determination region in said monitor target image is a given threshold or more.

3. The substrate processing method according to claim 1, wherein an image taken when said nozzle is determined to have stopped moving is set as said first standard image, said image being one of said images taken successively by said imaging part.

4. The substrate processing method according to claim 3, wherein in said step (d), multiple monitor target images are sequentially compared to said first standard image to determine discharge of a processing liquid from said nozzle, said multiple monitor target images being taken successively by said imaging part after stop of movement of said nozzle is determined.

5. The substrate processing method according to claim 4, wherein in said step (d), normalization by the area of said determination region is performed for comparison between said first standard image and said monitor target images.

6. The substrate processing method according to claim 5, wherein in said step (d), a processing liquid is determined to be discharged from said nozzle if a moving average of respective differences of monitor target images of a given number from said first standard image is a given threshold or more.

7. The substrate processing method according to claim 3, wherein position abnormality of said nozzle in said processing position is determined by comparing a second standard image and said first standard image, said second standard image being an image of said imaging region taken by said imaging part when said nozzle is placed in said processing position correctly.

8. The substrate processing method according to claim 7, wherein the position of said nozzle is determined to be abnormal if a difference between the coordinate of said nozzle in said second standard image and that of said nozzle in said first standard image is a given threshold or more.

9. The substrate processing method according to claim 7, wherein in said step (d), the position of said determination region in said first standard image and that of said determination region in said monitor target image are moved based on a result of comparison between said second and first standard images.

10. A substrate processing method of discharging a processing liquid to a substrate, comprising the steps of:
    (a) specifying the coordinate of a nozzle from which a processing liquid is discharged in a position standard image and setting a rectangular region including a tip of said nozzle as a reference pattern, said position standard image being an image of an imaging region including said tip of said nozzle in a processing position taken by an imaging part when said nozzle is placed in said processing position correctly, said processing position being above a substrate to be held by a substrate holder;
    (b) determining position abnormality of said nozzle in said processing position by comparing an image of a partial region to said reference pattern in said position standard image, said image of said partial region corresponding to said reference pattern and being a part of an image of said imaging region taken by said imaging part when said substrate holder holds a target substrate and said nozzle has moved from a standby position outside a cup surrounding said substrate holder to said processing position;

(c) setting a discharge determination region including a columnar part of a processing liquid discharged from said tip of said nozzle to reach a substrate held by said substrate holder in said position standard image based on a discharge width of said nozzle and a distance between said tip of said nozzle and said substrate held by said substrate holder;

(d) determining discharge of a processing liquid from said nozzle by comparing said discharge determination region in a discharge standard image and said discharge determination region in a monitor target image, said discharge standard image being an image of said imaging region taken by said imaging part before a processing liquid is discharged from said nozzle having moved to said processing position, said monitor target image being an image of said imaging region taken thereafter by said imaging part; and (e) setting a value intermediate between a maximum and a minimum as a threshold, said maximum being a maximum of a difference in said discharge determination region between an image of said imaging region taken by said imaging part when a processing liquid is not discharged from said nozzle and said position standard image, said minimum being a minimum of a difference in said discharge determination region between an image of said imaging region taken by said imaging part when a processing liquid is discharged from said nozzle and said position standard image, wherein in said step (d), discharge of a processing liquid from said nozzle is determined by comparing a difference in said discharge determination region between said monitor target image and said discharge standard image to said threshold.

11. The substrate processing method according to claim 10, further comprising the steps of:

(f) storing said image of said imaging region used in said step (e) and taken by said imaging part when a processing liquid is not discharged from said nozzle and said image of said imaging region used in said step (e) and taken by said imaging part when a processing liquid is discharged from said nozzle; and (g) verifying said discharge determination region set in said step (c) and said threshold set in said step (e) using said images stored in said step (f).

12. The substrate processing method according to claim 10, wherein in said step (a), the coordinate of said nozzle is specified in a difference image showing a difference between a reference image and said position standard image, said reference image being an image of said imaging region taken by said imaging part when said nozzle correctly placed in said processing position has moved a given amount in a given distance.

13. The substrate processing method according to claim 12, wherein in said step (a), the coordinates of opposite ends of said nozzle in a width direction and the coordinate of said tip of said nozzle are specified based on a tone value profile in said difference image.

14. A substrate processing method of discharging a processing liquid to a substrate, comprising the steps of:

(a) holding a new target substrate with a substrate holder;

(b) after said new target substrate is held by said substrate holder, moving a nozzle from a standby position outside a cup surrounding said substrate holder toward a processing position above said substrate held by said substrate holder;

(c) taking an image of an imaging region including a tip of said nozzle with an image part in a case where said nozzle is successively in said processing position at given intervals from a point in time after said substrate holder holds a new target substrate and said nozzle starts moving from said standby position toward said processing position;

(d) determining that said nozzle has stopped moving when a difference between successive images obtained in the step (c) is a fixed value or less; and (e) determining position abnormality of said nozzle in said processing position by comparing a position standard image, which is an image of said imaging region taken by said imaging part when said nozzle is placed in said processing position correctly, and an image in said successive images at a time when said nozzle is determined to have stopped moving in the step (d).

15. The substrate processing method according to claim 14, further comprising a step of (f) specifying a coordinate of said nozzle in said position standard image and setting a rectangular region including a tip of said nozzle as a reference pattern, wherein in the step (e), position abnormality of said nozzle in said processing position is determined by comparing an image of a partial region to said reference pattern in said position standard image, said image of said partial region corresponding to said reference pattern in said successive images at a time when said nozzle is determined to have stopped moving in the step (d).

* * * * *